(12) United States Patent
Lee

(10) Patent No.: US 11,233,421 B2
(45) Date of Patent: Jan. 25, 2022

(54) QUANTUM KINETIC WELL

(71) Applicant: McKane B. Lee, Arlington, WA (US)

(72) Inventor: McKane B. Lee, Arlington, WA (US)

( * ) Notice: Subject to any disclaimer, the term of this patent is extended or adjusted under 35 U.S.C. 154(b) by 0 days.

(21) Appl. No.: 17/228,925

(22) Filed: Apr. 13, 2021

(65) Prior Publication Data

US 2021/0320523 A1    Oct. 14, 2021

Related U.S. Application Data

(60) Provisional application No. 63/009,355, filed on Apr. 13, 2020.

(51) Int. Cl.
*H03K 17/60* (2006.01)
*H02J 50/00* (2016.01)
*H03K 17/56* (2006.01)
*H02N 99/00* (2006.01)

(52) U.S. Cl.
CPC .......... *H02J 50/001* (2020.01); *H02N 99/00* (2013.01); *H03K 17/56* (2013.01)

(58) Field of Classification Search
CPC .......... H03K 17/567; H03K 17/04123; H03K 17/6877; H03K 17/063; H03K 17/6874; H03K 17/56; H02J 50/001; H02N 99/00
USPC ........................................................ 327/432
See application file for complete search history.

(56) References Cited

U.S. PATENT DOCUMENTS

| 2009/0128972 | A1* | 5/2009 | Wu .......................... H02H 7/09 361/77 |
| 2014/0070871 | A1* | 3/2014 | Shumaker ............ H03K 17/795 327/427 |
| 2016/0065207 | A1* | 3/2016 | Bhutta .............. H01J 37/32183 438/10 |
| 2021/0156037 | A1* | 5/2021 | Lee .......................... C25B 9/65 |

\* cited by examiner

*Primary Examiner* — Quan Tra
(74) *Attorney, Agent, or Firm* — Emerson, Thomson & Bennett, LLC; Roger D. Emerson

(57) ABSTRACT

Provided herewith is a closed loop circuit including a transistor operable as a microscopic switch device to amplify electron pressures. The transistor has a collector connected to a positive voltage source. An optocoupler is provided, connected in parallel to the positive voltage source, and triggered in response to a triggering unipolar pulse from a network. An output of the optocoupler is connected to a base of the transistor. A capacitor is provided, connected between the emitter of the transistor and a ground, and having an anode and a cathode for receiving a capacitive dielectric medium therebetween, such that, electrons flow through dielectric medium to the transistor from a ground state in order to break down the dielectric material. In the preferred embodiment, the dielectric material includes water which is dissociated into hydrogen and oxygen.

13 Claims, 27 Drawing Sheets

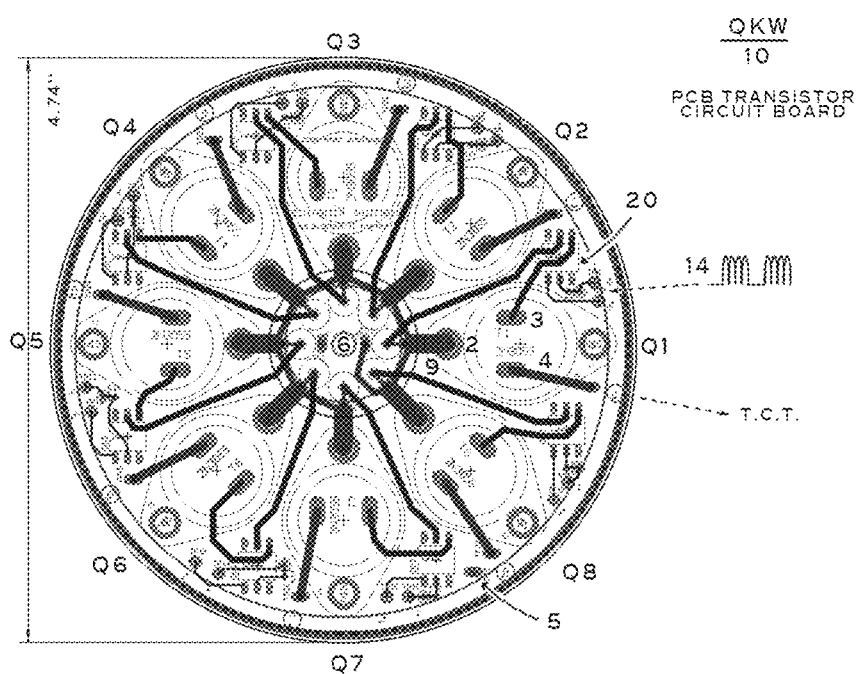
FIG. 2A1

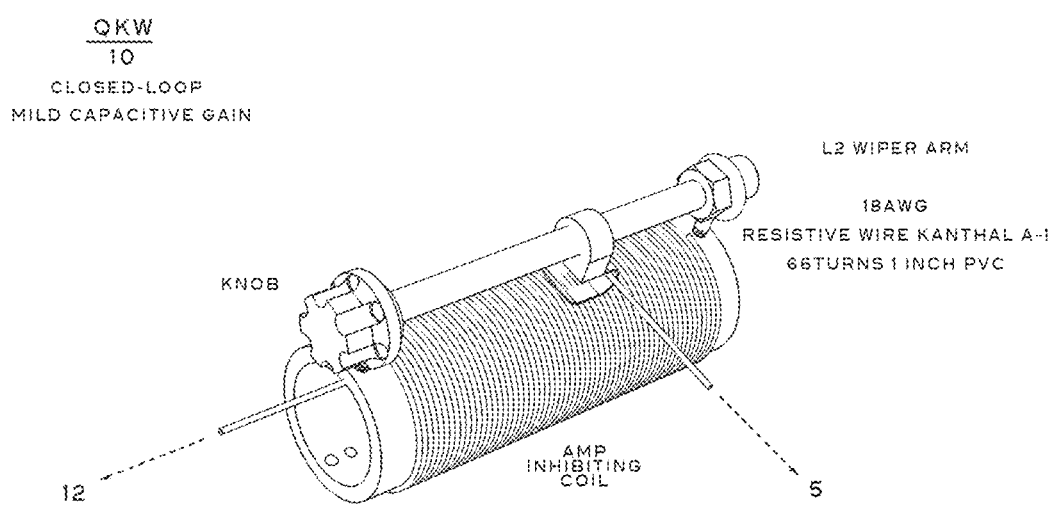
FIG. 2B1

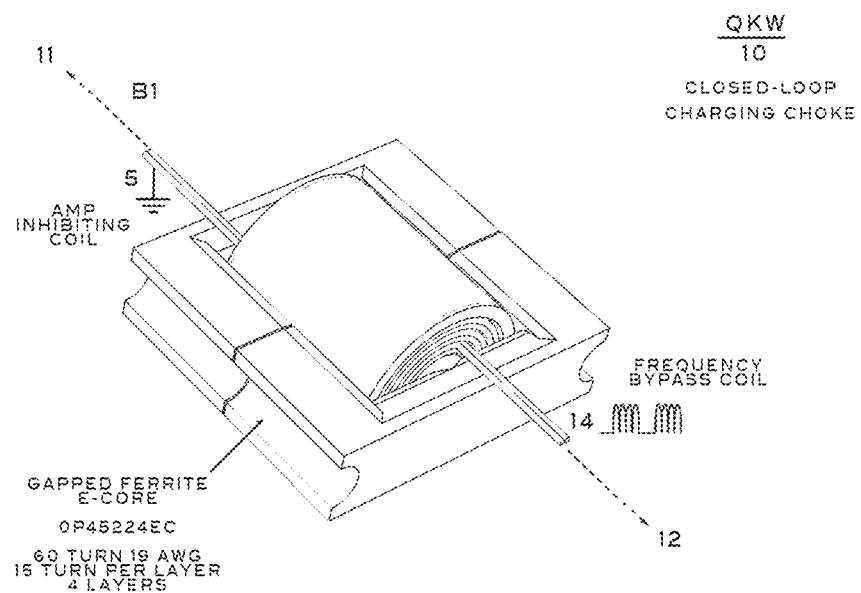
FIG. 2C1

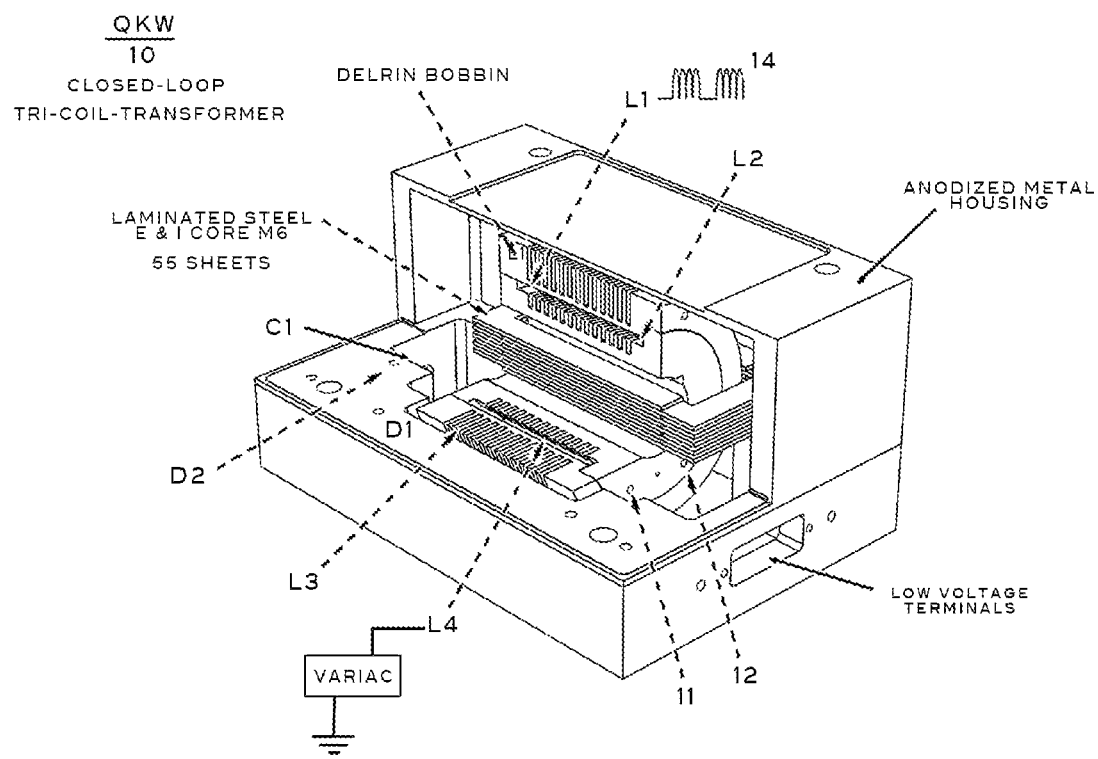
FIG. 2D1

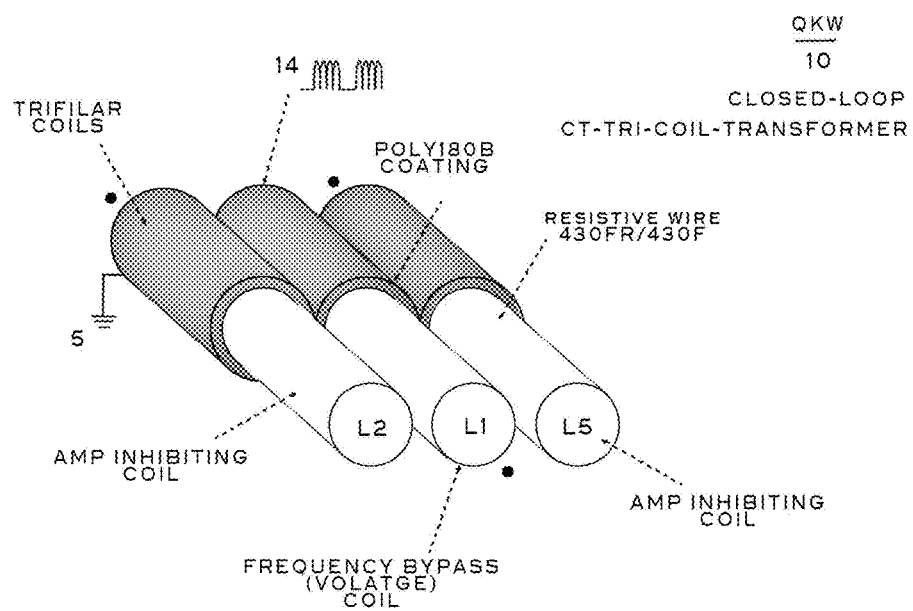
FIG. 2E1

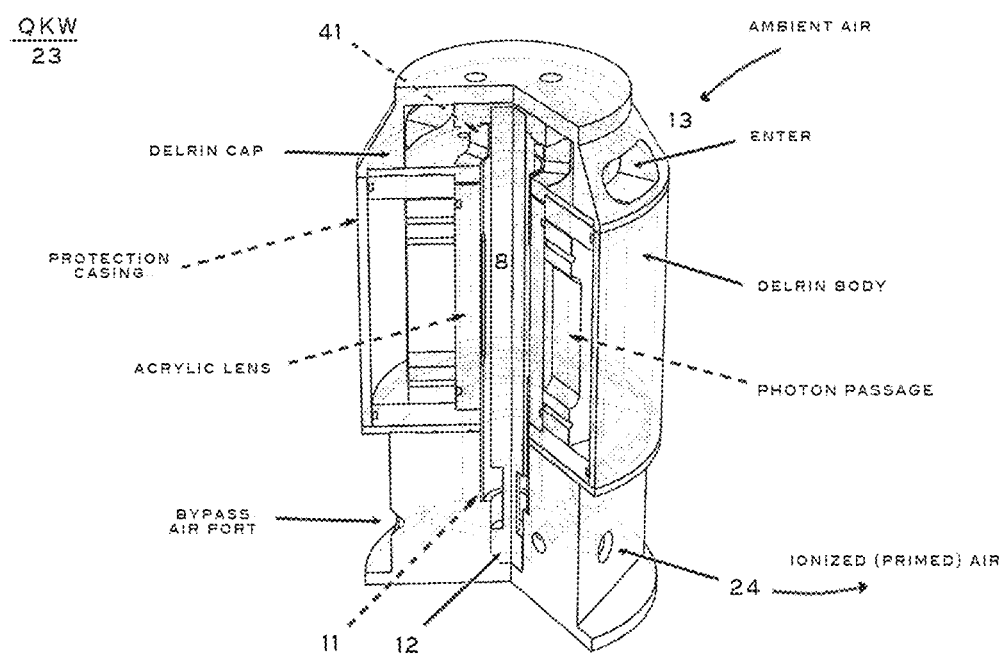
FIG. 3A1

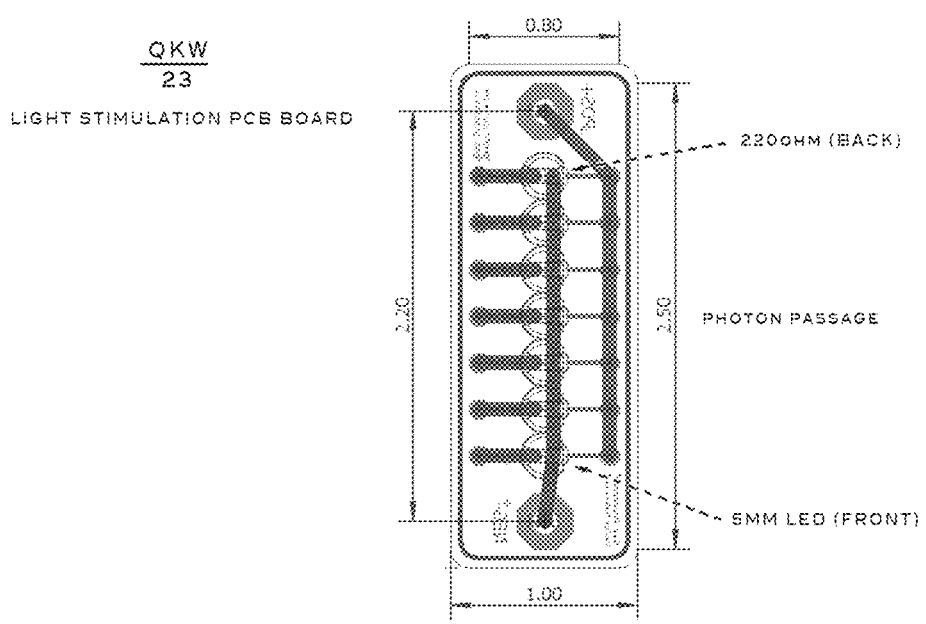
FIG. 3A2

QUANTUM KINETIC WELL

CROSS-REFERENCE TO RELATED APPLICATIONS

This application claims the benefit of U.S. provisional patent application Ser. No. 63/009,355, filed on Apr. 13, 2020, which is incorporated herein by reference.

BACKGROUND OF THE INVENTION

A. Field of Invention

This invention pertains to the field of energy harvesting, particularly the performance of electrolysis using merely voltage, not amperage, in a purely physical process coupled with specific arrangements of electronic components within a closed-loop electrical system.

B. Description of the Related Art

Nature abhors a pure vacuum Dielectric mediums are replete with infinitesimally small quantum flux wave motions (quarks, mesons and gluons). Written in ancient texts, the Children of Aether were the Land, Heavens, and the Sea Everything must come from something; even the ancients knew this to be fact.

Fast forward to modern times, the "Quantum vacuum flux vibration" is a very common name given for the Aether in the science community. James Clerk Maxwell, Einstein, Dirac and many other physicists postulated the Zero Point Energy flux during the early 1900s. Only recently, the Zero-Point Energy flux was confirmed with Casimir effects and Bose-Einstein Condensate experiments. The calculations by Heisenberg known as the Heisenberg Uncertainty Principle equation aided in grounding these perpetual quantum wavelet behaviors in understanding. The quantum universe can never reach absolute zero freezing temperatures due to the innate "wave like jitter" of the Aether (Matter and Anti-matter) oscillations. It can only get very close due to the internal "self-energy" fluxing pressures of Zero-Point Energy oscillation motions of all atomic substrates of the universe's perpetual energy. The quantum vacuum is a very active place. It is crawling with electron-positron pairs, proton-antiproton pairs, photons, etc. Perhaps, there is a mechanism or device that can harness or harvest the all-pervasive Aether jitter—The Electron. There is such a device.

These behaviors are driven by essentially small voltage perturbations within the dielectric of space and time (potential differences front jittering charged particles). The jittering action of the electron's (+/−) pressure, for example, allows scientists to measure the energy density but not the location simultaneously. And vise versa, if the electron's location is measured, we will never know the energy density of that electron at that, moment in time. This opens the door to exploit and utilization of these Quantum-Mechanical effects and Quantum Energy potentials called Superposition. Which, means, the electron can be both a wave and a particle all at the same time due to its internal jittering motion and spin. These quantum attributes thus can be harnessed, focused and channeled into a working electronic "Closed-Loop" resonate circuit transmitter/receiver apparatus.

Oscillating or switch mode behaviors of electrons in a modern day electronic devices are called transistors. They can amplify electron behavior. And most interestingly, yet, not known to many, the electron field effects can be transmitted from the transistor junction point (microscopic) to the ground state plate surface (Terms Surface) of a capacitor antenna (macroscopic). After all, this is the same phenomenon upon which telecommunications is based. The operations of a radio, audio amplifiers, satellites, sonar, radar, transmitters, receivers and other wireless technology are quite similar.

In the case for electrons interacting with a metal plate surface such as capacitors i.e. antenna, the presence of free electrons in metals is revealed by phenomena other than electrical conduction, these include thermionic emission, radiation energy and the photoelectric effect being particularly important examples. Free electrons upon the surface of a metal are not entirely "free" to leave the confines of the isolated piece of metal. It must be supposed that the surface of the metal presents some kind of "barrier" preventing their escape under normal mode conditions, bin the electrons are apparently able to move about within the metal in much the same way that gas molecules are free to move within the confines of the enclosing vessel (antenna). This is the same quantum phenomenon within a transistor junction points. The momentum p of a free electron is related to the wavelength $\lambda$ of the electronic wave. Thus, the quantum vacuum flux can be locked onto much like a radio wave within an (tanks circuit), R (resistance) L (inductance) C (capacitance) circuit i.e. radio circuit network . . . .

In the foregoing patent disclosure, a step-by-step "base-mode" triggering and attenuation will be discussed. Referenced schematics of the Quantum Kinetic Well (dielectric collapse) mechanism using transistors in conjunction with various electronically component(s) like coils, chokes, center-taps, diodes, phototransistors and resistors within a very specifically designed "Closed-Loop" capacitor/antenna will be discussed in detail. Many variations are possible and are only limited to the imagination of the engineer. Application patent invention discloses Q.K.W. will be affixed to a Tri-Coil-Stargate-Transformer as a practical energy-harvesting device that is scalable in nature.

SUMMARY OF THE INVENTION

A semiconductor or a series of semiconductors, typically a NPN or PNP, an SCR, H-Bridge, JFET or MOSFET type transistors are arranged in series or parallel to a capacitive anode from the transistor's emitter within a "Closed-Loop" electrical load. Within the transistor a tiny chip of crystalline material, usually silicon, is triggered, amplifies or switches electric current during operations. Basically, a semiconductor as an ensemble of positive charges with bounded electrons around them which as a ground-state switch. The design is typically a three-terminal semiconducting device that controls current (electron flow) from a common ground. A small base current, is passed through the P-Type terminal, which when applied, ultimately controls a larger current flow (collector). Once (base) is triggered, the (emitter), which is connected to the anode and thus groundside of the circuit allows current to flow through to the (collector) side of the transistor. The transistor is basically a high to low resistor that cast supply high resistance values for (off-state) impeding electron flow and a low resistance for (on-state) low impeding mode changes. This same phenomenon can be applied to the capacitive antenna of the capacitor plate(s) imparted to a dielectric medium.

Transistors (i.e, semiconductors) begin the process due to their innate "trigger-able" voltage source backpressure, this exhibit a physical frequency mechanism by which the material moderately (or strongly, depending on its electron hole polarization effects) changes or screens the applied fields (N-Type or P-Type Zones). The unipolar trigger frequency, typically a 5 volt square-wave pulse train, now plays the same role as in the case of metals (antenna), concerning the ability of the material to react "on time" and "off time" to screen the applied voltage gradient field. These field effect(s), which are present in the inherent transistor architecture can manifest and be amplified to a capacitor plate framework, transformer coil framework and electronic resistance framework or dielectric constant network. This is known in audio amplification (tank circuit) concepts as a frequency response caused by regeneration, brought about through sufficient 'phase angle' rotation to convert negative feedback to positive feedback. Utilization of all these parameters only further optimizes the application as rebounding ground state transient electrons in the "Closed-Loop" circuit interact with the antenna or anode of the capacitor.

A transistor or set of transistors affixed to a series of resonant coils network with an "Open Circuit" capacitor now implement into a "Closed-Loop" circuit as controllable switches for directing of ground state electrons. These devices are also used for radio amplifiers, transmitters, receivers and serve as binary communication devices for computers (On to Off switching modes—Push/Pull). The primary triggering of the devices comes from the internal electron pressure differentials between the N-Type regions and P-Type regions (holes). N-Type regions are associated an excess of negative electrical charges in a semiconductor. P-Types are an extrinsic semiconductor in which, the electron hole density exceeds the conduction-electron density. Electron holes and free electrons within the material substrates, which, make up the transistor, establish these pressure differential regions. During an electron hole saturation event (base voltage breakdown), as a small current traveling through the base begins, the P-Type thus allows a larger current to flow from ground sound emitter to the collector. Thus, current is controlled much like a hydraulic switch.

The transistor is arranged in such a way within a "Closed-Loop" tank circuit to tap (phase angle rotation) into the capacitors "capacitive reactance". This is done solely because a coil of wire (inductor) has a shared mutual capacitance between each coil of wire. Ultimately, allowing any coil of wire (inductor) to phase shift into resonance with any type of capacitor. Resonant frequency attenuations can be varied by coil wraps number count, wire resistance values, capacitive values and sizing of capacitive plates. The voltage (capacitive gain) of the capacitor can theoretically reach infinity if electronic components allow for it. During this phenomenon (resonance), current is limited to lowest values while voltage climbs exponentially. It should be, "firmly noted", that during electrical resonance, the dynamic resistance of the tuned circuit becomes quite large, and the total impedance from the capacitor grid plates to common ground is increased dramatically.

System configurations allow for a capacitor, also known as an antenna to lock onto the inherent oscillating/vibrating electron pressure(s) inherent in the quantum well within water, air, the ionosphere, metal liquids and even the vacuum of space. A capacitor plate, can take on any size or shape, antenna can be converted into a negative resistance Quantum Kinetic Welt energy-harvesting device for power consumption (polarization). Or, more scientifically put, converting a capacitor from an "imaginary load" to a "real load" to induces work upon the temporal matrix of space and time.

In prior art electronics; common ground current may flow in a "Closed-Loop" may be attenuated using an NPN or a PNP transistor's base current switch mode. However, in this "Normal-Mode" (positive resistance), current is "pushed" through a circuit via voltage from the common ground state. In a "negative-resistance mode" the electrons are not so much "pushed" through a circuit by voltage, but rather impeded to flow through a new type of "Quasi-Closed-Loop" circuit via voltage perturbations pressure differentials. This effect ultimately "pulls" electrons. And since, electrons always find the path of least resistance, it is easy to see how electrons would fail into this "new state" of Quantum Kinetic Well induced to the (anode). In this "negative-resistance resonant oscillation mode" capacitive dielectric cavitations take place in a physical manner due to, the electrical transient mobilization to renormalize electron Superposition INTO the dielectrics Zero-Point Energy atomic ground state . . . . This is the same physical force i.e process as holding a beach ball filled with air under water in a pool or how a large massed planetary object "pulls" smaller objects, but in this case, this is done electrically in the form of resonant ground state electron ballasting.

Establishing negative resistance oscillation within a capacitor matrix allow(s) for dielectric medium ground state "micro-cavitations" (holes) to occur as the electrons are "pulled" towards the anode of the capacitor in a physical manner and not "pushed" by the common ground cathode. This is known as "homo-space charge" voltage (high voltage potentials with low current density). In prior art applications electronics, "hetero-space charge" current flows freely from common ground state. This is known as an electrical "dead-short" (voltage drops to lowest value while current increases).

This phenomenon thus, results in the polarized or "tickling" (voltage peak spiking) of the Quantum Vacuum Flux i.e. Aether. This, by nature, is a sub-atomic process imparted to constituents like quarks, gluons and mesons as charged particles attempt to fill Quantum Flux holes in the affected dielectric mediums. This voltage gradient strength is inversely proportional to the square of the radius but it is also directly proportional to the mass-to-charge ratio of the resonant cathode surface.

When voltage is increased across a resonant "Closed-Loop" negative differential circuit, the ground state current will decrease (increase in dynamic resistance). This is due to inherent design of the Tri-Coil Transformer (T.C.T.) resonant effects imposed on the electrons on the cathode.

In this new application of electronics, the cathode's electrons are impeded by resonant flux perturbations (dynamic resistance). This phenomenon is due to the fact the resonant common ground state cathode electrons have kinetic motion, but NO or LITTLE directional current motions toward VCC power supply. Thus, the only "flow" of electrons comes front the "free" electrons barrier of the anode via atomic quantum tunneling and Zero-Point Energy ground state renormalization.

In the foregoing patent, a dielectric collapsing takes place during this "new" physical mode of electrical operation, which is 180 degrees out of phase with "normal" Faraday electronics. Instead of a capacitor plate cell "arc discharge" stemming from the cathode, this is a dielectric electron collapse discharge event extracted from the inherent atomic Quantum Zero Point Energy of the dielectric—Quantum Kinetic Well.

This is a physical process upon the dielectric constant values of the quantum flux vacuum of every dielectric medium caught between the energized capacitive antenna plates. The effects are amplified or enhanced with cross-breeding of circuit components i.e. coils, chokes, step-up transformers, center tapped transformers, Helmholtz resonant cavities, Maxwell coils, toroidal coils, waveguides, magnetic flux fields, diodes and many other electrical elements. Those skilled in the art will follow proper design applications to the process stated below.

In the present invention, variation(s) and an Arc Reactor device configuration will be explored for enhancements and utilization of the Quantum Kinetic Well phenomenon will be discussed.

To that end, the present invention includes a closed loop circuit having a transistor operable as a microscopic switch device to amplify electron pressures. The transistor has a collector connected to a positive voltage source. An optocoupler is provided, connected in parallel to the positive voltage source, and triggered in response to a triggering unipolar pulse from a network. The output of the optocoupler is connected to a base of the transistor. A capacitor is connected between the emitter of the transistor and the ground, and having an anode and a cathode for receiving a capacitive dielectric medium therebetween, such that, electrons flowthrough dielectric medium to the transistor from a ground state in order to break down the dielectric material.

In one exemplary embodiment, the positive voltage source is one of a converted step-up transformer or an AC to DC variac. The transistor can be one or more of an NPN, PNP or MOSFET type semiconductor.

The closed loop circuit of the present invention can also include an amp inhibiting coil in series between the capacitor and the ground, for aiding in impedance amperage restriction. A wiper arm of the amp inhibiting coil can be provided for allowing fine-tuning band gain filtering attenuations to the amp inhibiting coil. A frequency bypass coil can also be included in series between the emitter of the transistor and the capacitor for allowing instantaneous voltage perturbations to the capacitor. Additionally, a primary coil and a secondary coil can also be provided. The secondary coil is in series between the emitter of the transistor and the ground, and in parallel to the capacitor, for stepping up voltage to capacitor. The primary coil is connected to a separate power supply and interacts with the secondary coil to determine step-up or step-down relationships. A second amp inhibiting coil can be connected between the secondary coil and a zero-reference voltage, for aiding in electron retarding drift velocities.

The closed loop circuit of the present invention can also include a load resistive electrical element in series between the emitter of the transistor and the capacitor to resist electron drift velocities. The transistor is a first transistor and the present circuit can also include a second transistor connected in parallel with the first transistor to the capacitor wherein the second transistor is configured to pulse during an OFF interval of the first transistor so that the second transistor pulses with "A" input and the first transistor triggers with a "B" input.

In another aspect, the present closed loop circuit can includes an amp inhibiting coil in series between the capacitor and the ground, for aiding in impedance amperage restriction and a frequency bypass coil in series between the emitter of the transistor and the capacitor for allowing instantaneous voltage perturbations to the capacitor, such that the amp inhibiting coil and the frequency bypass coil comprise a tri-coil transformer in which the respective coils are bifilar coils wrapped together side by side around one of a solenoid core or toroidal core.

As described herewith the dielectric material can include water. The breakdown of the water can be a dissociation process (electrolysis) which results in hydrogen and oxygen. It is to be appreciated that other suitable dielectric materials can be implemented with the present invention.

In another aspect, a closed loop circuit is disclosed herein including a transistor operable as a microscopic switch device to amplify electron pressures. The transistor has a collector connected to a positive voltage source. An optocoupler is connected in parallel to the positive voltage source, and triggered in response to a triggering unipolar pulse from a network. An output of the optocoupler is connected to a base of the transistor. A capacitor is connected between the emitter of the transistor and a ground, and having an anode and a cathode for receiving a capacitive dielectric medium therebetween, such that, electrons flow through dielectric medium to the transistor from a ground state in order to break down the dielectric material. A tri-coil transformer is provided including an amp inhibiting coil in series between the capacitor and the ground, for aiding in impedance amperage restriction, and a frequency bypass coil in series between the emitter of the transistor and the capacitor for allowing instantaneous voltage perturbations to the capacitor. The amp inhibiting coil and the frequency bypass are bifilar coils wrapped together side by side around one of a solenoid core or toroidal core. The anode and the cathode of the capacitor are concentrically-mounted cylindrical components mounted along a central axis of the tri-coil transformer.

BRIEF DESCRIPTION OF DRAWINGS

FIG. 2A1 is a top view of a PCB transistor circuit board according to FIG. 2A.

FIG. 2B1 is a perspective view of an L2 coil wiper arm according to FIG. 2B.

FIG. 2C1 is a perspective view of an L2 charging choke according to FIG. 2C.

FIG. 2D1 is a perspective view of a Tri-Coil Transformer according to FIG. 2D.

FIG. 2E1 is a perspective view of a "Closed Loop" Tri-Coil-Transformer according to FIG. 2E.

FIG. 2G is a schematic showing the "Electron Extraction" process affixed to Tri-Coil-Stargate Transformer "Quasi-Closed-Loop" circuit.

FIG. 3A1 is a perspective view of an embodiment of Quantum Well formation according to FIG. 3A.

FIG. 3A2 is a top view of a light stimulation PCB board.

DETAILED DESCRIPTION

Figure 1A:
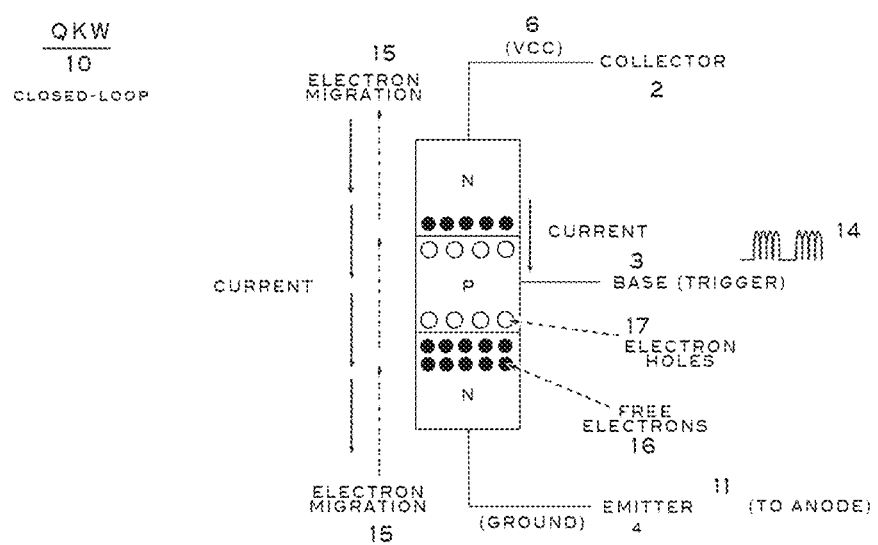
FIG. 1A is a schematic layout of the base mode of operations for "microscopic" negative resistance capacitive cavitations.

Reference is now made to the drawings wherein the showings are for purposes of illustrating embodiments of the article only and not for purposes of limiting the same, and wherein like reference numerals are understood to refer to like components.

Technical Field: The present apparatus includes six components:
1. Any transistor NPN, PNP and/or MOSFET type semiconductor (Q1)
2. Low Voltage Pulsing Circuit Network (43) & (45)
3. A Closed-Loop and/or Open-Loop Capacitor Circuit (8),
4. Dielectric Material Space—Free Electrons (13)
5. Resistors, Transformer, Center Tapped Transformer, Bifilar Chokes Coils or Trifilar Coils of Wire, (T.C.T.) or (T.C.S.T.) (10)
6. Grounded Voltage Supply 0-2,000 VDC (42)

Figure 1B:
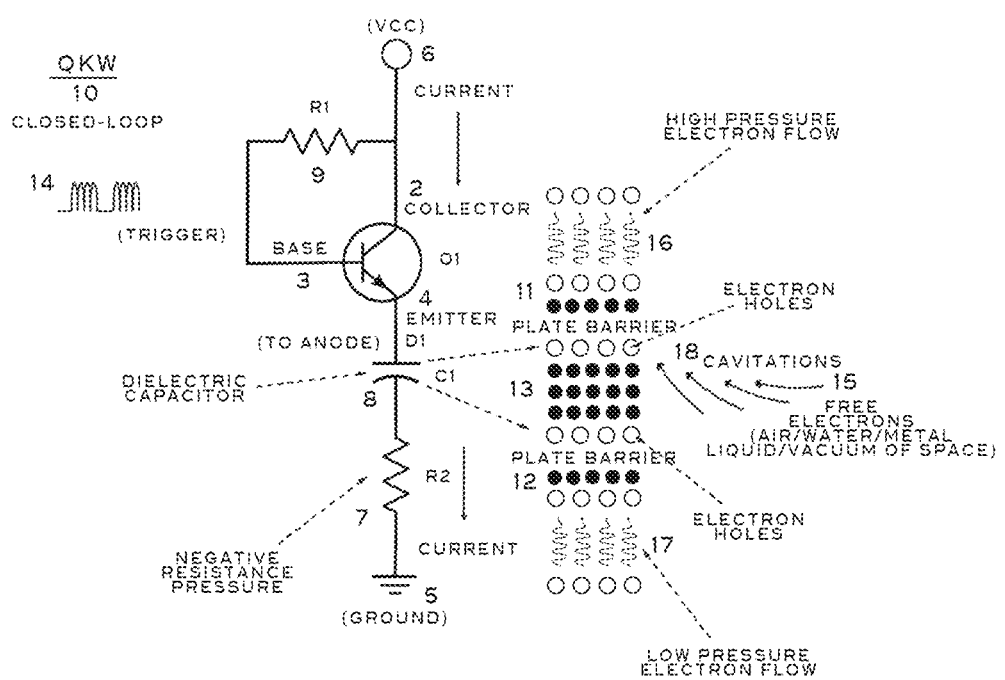
FIG. 1B is a schematic layout of the base mode of operations for "macroscopic" negative resistance capacitive cavitations.

Electrons 15 always flow, within an electronic circuit, towards the positive voltage source 6. Power supply 42 attenuation can be any AC to DC converted step-up transformer or AC to DC variac 6. In a preferred embodiment, a 5 amp, 0-120 VDC power-supply is used 42 Variable voltage D.C. Inputs range from a few volts to thousands of volts if necessary. As commonly known, and previously stated in said disclosure, the common ground 5 state electron "flow" also prefers to take the path of least resistance 7. See FIG. 2A. Traditional understanding is that "current" flows toward the ground state of a circuit. All electrical literature differentiates the current as different than the electron flow in a "Closed-Loop" circuit. See FIG. 1A. The, somewhat confusing, clarification will be revisited later in the disclosure. The important understanding resides merely in the fundamental behaviors of the electron may be influenced, altered and/or manipulated in order to trigger the Quantum Kinetic Well effect for direct energy harvesting See FIG. 1A-1C.

To begin the process a low voltage ON state a 5 volts potential square-wave trigger is set to transistors Q1 base 3, this opens the primary current to flow 15 (fills electron holes). Load resister [10 watt 100 ohm] 9 (R1) is placed between base 3 and collector 2 to protect transistors base from VCC power 6. See FIG. 1B. This unipolar pulse 14 burst is accomplished with any type of alternating pulse gate circuit driver 43 (frequency generator) [1 hz-150 Khz PWM]. Incorporating a sequencer driver 45 aids in distributing the gated pulse firing unipolar pulses 14 to the Tri-Coil-Transformer (T.C.T.) (T.C.S.T.) to enhance the Quantum Kinetic Well phenomenon. See FIG. 2G. During OFF state pulses, a "snapping" effect takes place within the "Closed-Loop" circuit as elements attempt to readjust. This readjustment pressure comes in the form of electrostatic voltage spikes. This is due to electron renormalization WITHIN and AROUND the electro conductive wire. This is known as a transient. Transients typically are to be "avoided" in modern electronics, but we can utilize these abrupt electric readjustments to confuse the electron in a "Closed-Loop" circuit to do work it normally would not . . . .

When transistor Q1 is connected to a "Closed-Loop" circuit 10 in a common base configuration with pulsing network 43 and the power amplification 42 is established in this configuration to optocoupler 20. Optocoupler 20 is an [H11D1], which isolates the low voltage pulse trigger 43/45 from the high voltage power supply rail 42. It is referred to as "Alpha" ($\alpha$) stance. Alpha is a ratio of collector current to the emitter current. Alpha is always less than one in the ratio of current through Collector 2 to Emitter 4. See FIGS. 1A, 1B and 4D.

A positive NPN or negative PNP triggering pulse 14 can be set to the base 3 of the transistor. If a positive pulse, from pulsing network 43, is set to the base, the device is an NPN type triggering. This is referred to as a Low-Side Switching device. If the trigger pulse 43 is negative in reference to ground (Quantum Kinetic Well), the PNP type of semiconductor should be used (Quantum Kinetic Inertial Dampening). This is classified as a High-Side Switching device. There are several operational frameworks for these modern devices to fire properly. But in the preferred embodiment a Darlington 2N3055 NPN and/or 2N6678 type(s) amplifier semiconductors can be used. Those skilled in the art will be able to engineer for either PNP, SCR, JFET and/or MOSFET types of switching semiconductor modes. See FIG. 1A.

Since electron charges 15 must flow to the edge of the depletion region (transistor) 3, the present structure acts like a parallel plate capacitors for small voltage perturbations. A transistor Q1 is a microscopic switch device, which can amplify electron pressures to a capacitor 8 as the macroscopic dimensionality of the charge conjugate reactions within the "Closed-Loop" 10 circuit. See FIGS. 1A and 1B. The flow of electrons 15 within a circuit is modulated by the switching mode ON or OFF within the transistor Q1. See FIGS. 1A and 1B. The triggered ON mode also only allows ground state electrons 15 to flow past the heavily doped junction N-P points within the semiconductor. This junction point during ON mode is classified as high-pressure 16 differential pressures. Since electron flow 15 viscously through a nano-device i.e. (electro-conductive wire), is metaphorically like water flowing through an enclosed pipe, hydrodynamic pressure is felt nearly instantly in a water medium, and water within a pipe cannot be compressed. Electrons cannot be compressed due to Coulomb Repulsion forces. When the transistor is in the OFF mode, there is a low-pressure mode prohibiting electrons from flowing, which is felt instantly (i.e water hammer effects) within the confines of the "Closed-Loop" circuit and the capacitive 8 dielectric medium 13. Furthermore, this sudden switching of ON mode to OFF mode 14 inherently manifests small wave transients within wired circuit and capacitive dielectric 13 (exponential voltage curve potentials), such that it "electrically tickles the dielectric".

The linear relationship between the frequency of oscillation 14 and the control voltage 6 is established in the present arrangement. Greater voltage potential 6 increases polarization of dielectric cavitations 18, while greater unipolar pulse triggering 14 rate aids in polarization of dielectric 13 between the voltage zones 11 and 12. The polarization can be further amplified using special wiring configurations, which will be discussed in the following disclosure.

Figure 2A:
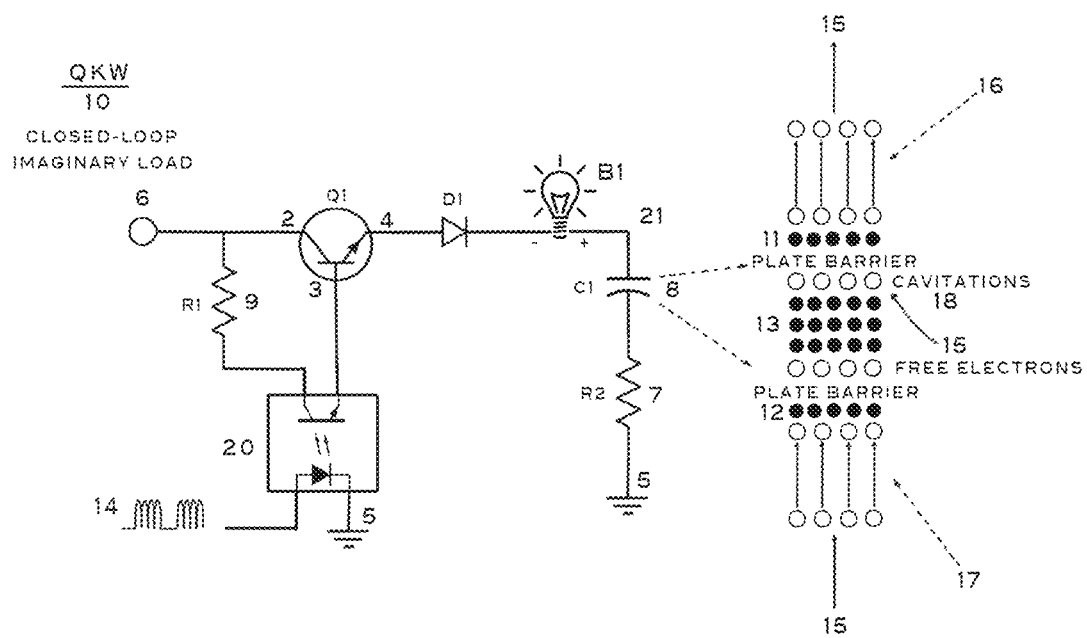
FIG. 2A is a schematic layout of the common ground resistor with no QKW effects.

Triggering Voltage Pressure—FIG. 2A

In the base wiring configurations, the dielectric 13 (ambient air) only allows current flow between anode 11 and cathode 12 once dielectric medium 13 breaks down. Air is art excellent insulator; it takes large voltage levels in order for air to breakdown. Typically on the order of 3 mega-volts per meter (Mv/m). Once the insulating dielectric air begins to breakdown, the air becomes partially conductive allowing electrons 15 to flow from cathode 12 to anode 11, or in this case the common ground 5 electrons 15 to flow to through Q1 transistor to VCC 6. Affixing said diode MUR4100ERL 1000 v 4 A to emitter 4 of the circuit, maintains proper electron flow 15 throughout "Closed-Loop" circuit See FIG. 2A.

An air capacitor in this framework stance is classified, as an open circuit. This is known as an "imaginary capacitive load". See FIG. 2A. In this normal mode, the electrons 15 will be forced to flow through dielectric 13 to the transistor are in the ON stage from the ground state 5. The impedance of the electrons 15 through the capacitor C1 is determined by dielectric constant's resistance value in ohms, which in this case air has a large resistance. It should be noted that there is a voltage pressure differential present in this situation but no electron flow. The flow rate of ground state 5 electrons 15 are dictated by dielectric constant values and resistance inherent in the medium 13. It would take an extremely enormous power potential 6 in order to induce current through the capacitor 8 (dielectric breakdown) and ultimately to B1 load. In this mode, the Quantum Kinetic Well cavitations 18 cannot be triggered. We will now add an inductor (coil) to facilitate a voltage enhancement effect using a resonance RLC tank circuit.

Figure 2B:
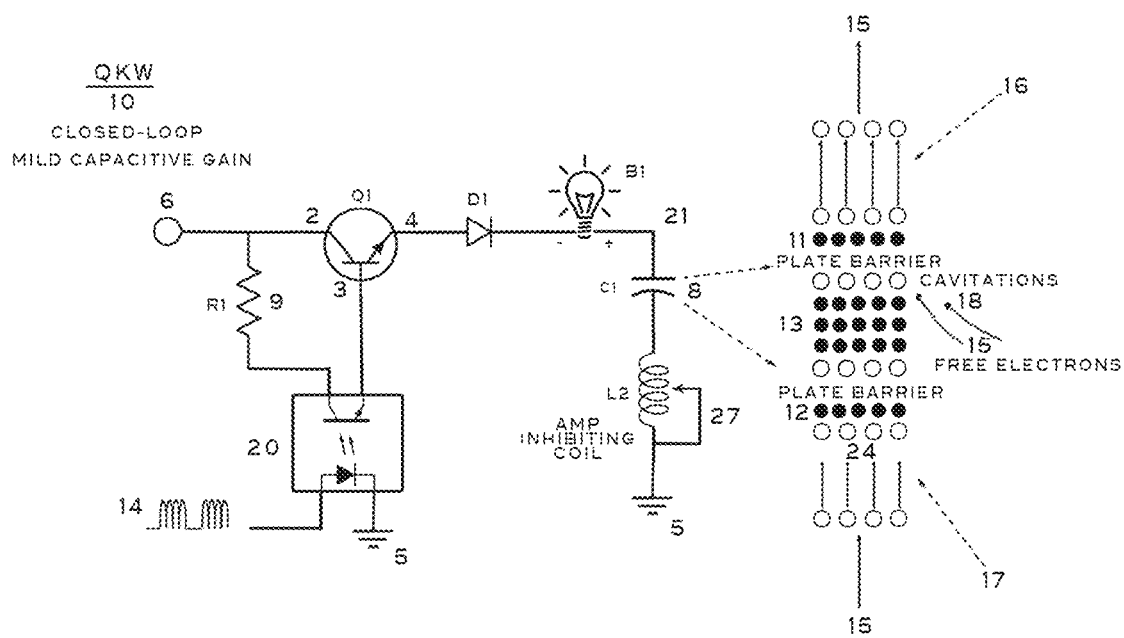
FIG. 2B is a schematic of L2 coil establishes resonant RLC tank circuit. Mild stimulation of QKW.

Tank Circuit Voltage Enhancement—FIG. 2B

An "ideal" audio amplifier can obtain resonance frequency strength at many varying attenuation frequency ranges. In order to establish a resonant characteristic electronic circuit, an inductor L2 (coil) and a capacitor 8 can be arranged in a parallel or series stance. See FIG. 2B. This coil L2 can also be classified as a "Amp Inhibiting Coil" because, during resonate frequency attenuation, the dynamic resistance 21 becomes quite large.

Affixing an inductor L2, coil of wire, creates a time dependent hysteresis curve into the circuit. This means, there is a "charging" and "discharging" effect in the form of a fluxing magnetic field 40 by the inductor L2 over a duration of time. Larger coils with more turns create slower charging effects; while smaller inductors with smaller turn counts create quicker charging/discharging rates. Adding a ferric (iron) material inside the coil L2 changes the magnetic flux saturation time frames.

The inductor L2 is the conjugate of the said capacitor C1. The inductor L2 stores a magnetic field, "Closed-Circuit", in a time varying matrix (inductive reactance), while the capacitor C1 stores an electrostatic charge, "Open-Circuit", in a time varying matrix (capacitive reactance). In this mode of operation, Q1 transistor switch mode unipolar pulse 14 may be set a resonant frequency to resonate with the mutual reactance values of the L2 and C1 electronic components into a state of "Superposition" where the said capacitor is both. This phenomenon transforms said capacitor C1 from an "imaginary capacitive load" into a "real capacitive load". In this mode of operation, voltage increases, while current 15 drops to lowest values. Inductor L2 may be affixed with a wiper arm 27 allowing fine-tuning band gain filtering attenuations.

In this mode of resonance, the Quantum Kinetic Well phenomenon begins. The dielectric cavitations 18 are established through resonate voltage spikes, but not controllable or vector-able via biased voltage perturbations. We have successfully "confused" the electron into a state of "Superposition", but now need to vector this phenomenon for work i.e. increase dynamic resistance. See FIG. 2B. In the following, we begin to further enhance the Quantum Kinetic Well effect by adding another inductive coil in same likeness as L2 coil.

Figure 2C:
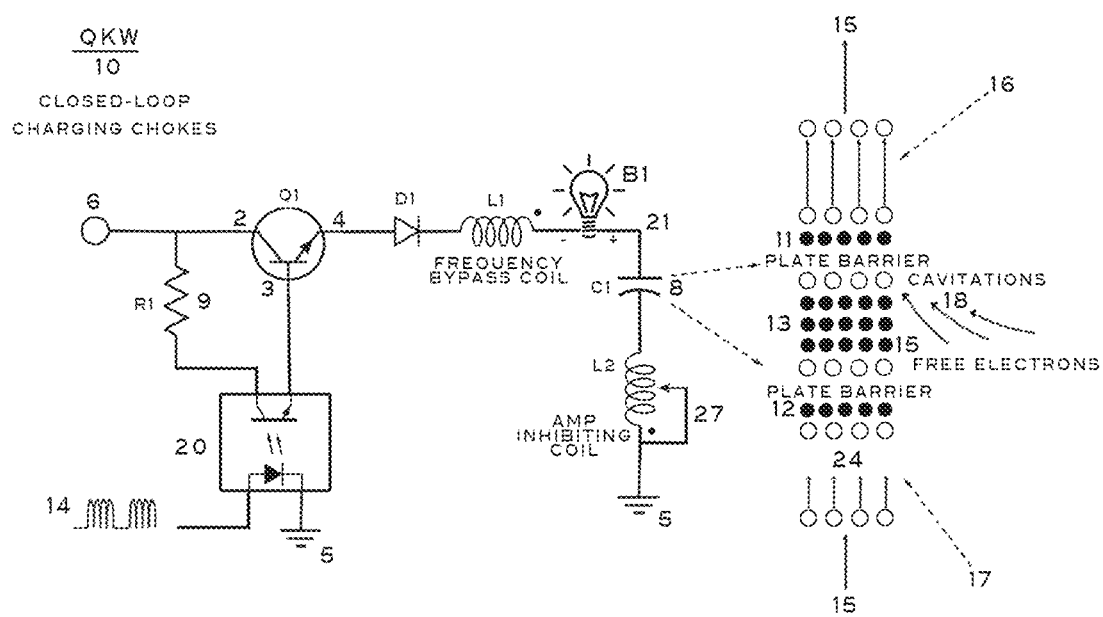

Bifilar Resonant Charging Chokes—FIG. 2C

Figure 3A:
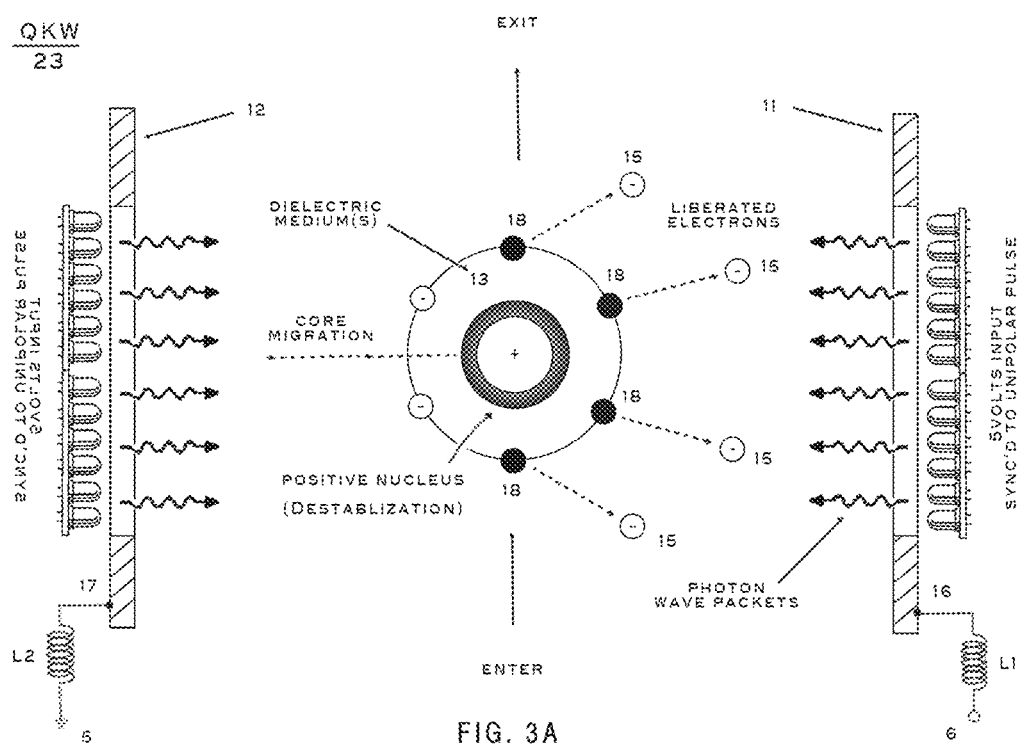
FIG. 3A is a diagram drawing of the dielectric polarization between anode and cathode and the Quantum Well formation. In addition, the photon interjection method to enhance the electron pressure differential values in and within the capacitor.
Figure 3B:
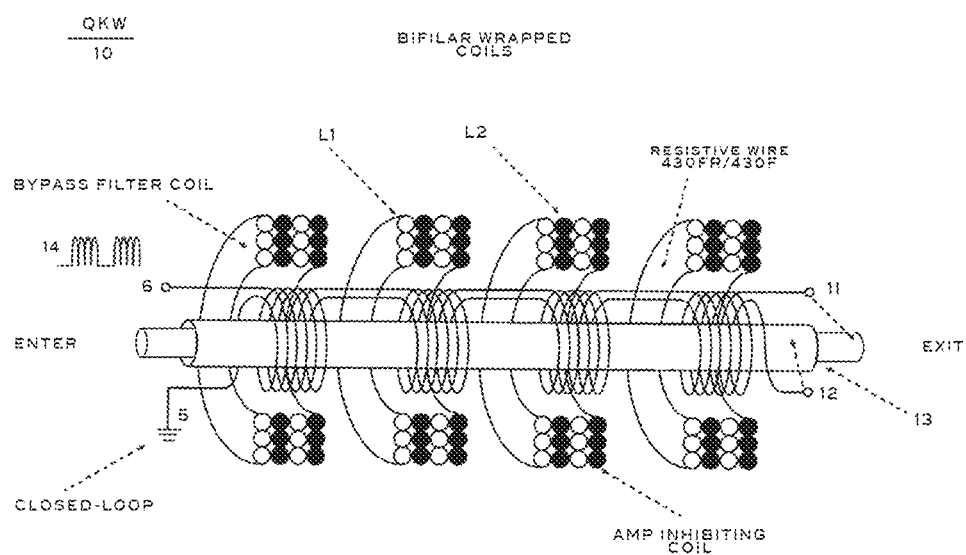
FIG. 3B is a diagram of the bifilar wrap design of the "Resonant Charging Chokes around electrodes 11 and 12 respectfully.
Figure 3C:
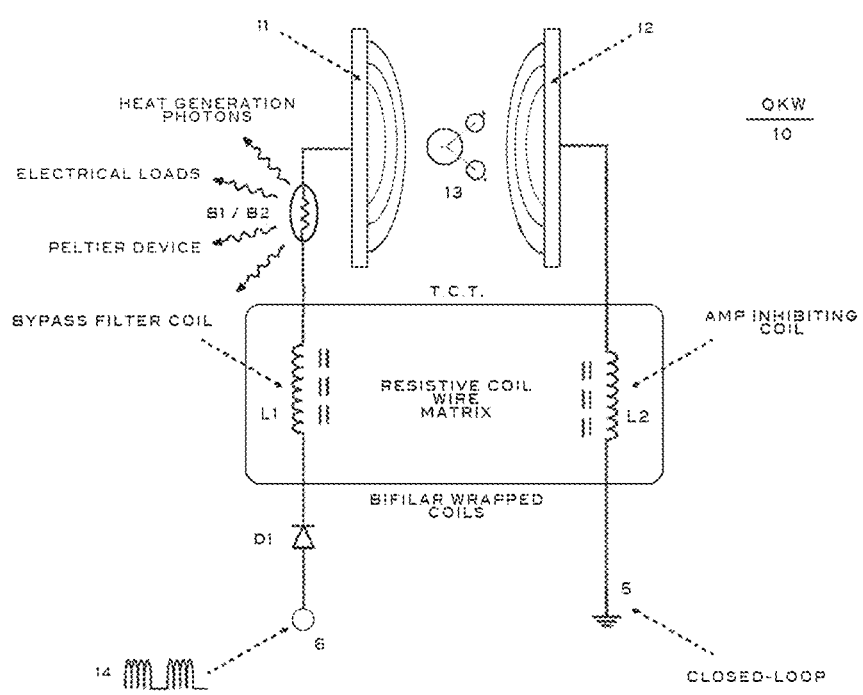
FIG. 3C is a diagram showing load resistive element affixed to/between "Resonant Charging Chokes".

A bifilar coil is two coil wires wrapped together side by side around a solenoid core or toroidal core [ferrite-65 mm×50 mm×6 mm ex-USSR NOS]. See FIGS. 3B, 3C & 4A. Coil wires L1 and L2 are same gauge value and cut to similar lengths. In this configuration, the start of coil turn L1 will be affixed to anode 11 of the capacitor 8. While starting of coil turn of L2 will be affixed to said, ground side of secondary coil L3. See FIG. 2C for orientation of coils.

Bifilar coil wraps can be grouped into wrapped sectors around the toroidal core. See FIG. 4A. These grouping can be arranged in any fashion to enhance the fluxing magnetic field lines 40 for desired results . . . .

L1 inductive coil allow instantaneous voltage perturbations to said capacitor C1. This is referred to as a "Frequency Bypass Coil". While L2, as mentioned above, aids in impedance amp restriction in the form of dynamic resistance "Amp Inhibiting Coil". Similarly the bifilar wrap L1 and L2 configuration enhances electromagnetic coupling potentials to said capacitor 8. Bifilar winding is a winding made non-inductive by winding two wires carrying current in opposite directions together, side-by-side, as one wire L2's function is to balance the resistance values of the ground state 15 and also impede electron flow from the ground state 5 since when energized at or near resonance. The L1 magnetic field strength also opposes electron flow (i.e., electron drift velocity) toward power supply 6. See FIGS. 3B & 3C. Resonant frequencies can range from 1 hz to 1 Mhz ranges, in this stance, the current flow (+ to −) and electron flow 15 (− to +) of the "Closed-Loop" circuit are superimposed on each other to enhance the voltage pressure to said capacitor 8 and "Closed-Loop" 10 enclosed wire(s). See FIG. 1A on current vs. electron flow.

In this configuration, a resonant charging choke system has been established. Voltage spikes can now be further amplified (transient voltage spikes) from the power supply 6 and pulse network 43. A fluxing "Quasi-Closed-Loop" circuit has now been established in this wiring configuration. As stated earlier, but must be stressed, bifilar/trifilar coils may be arranged in either solenoid design or toroidal configuration for magnetic flux enhancements. Additionally, orientation of magnetic flux lines 40 aid in the energy harvesting capacity of the Quantum Kinetic Well phenomenon 10. See FIG. 4C. Amp inhibiting coil L2, consisting of and not limited to, an air coil, ferrite coil, iron core or semi-ferromagnetic coil may be put in line between ground state and cathode 12 of the capacitor. See FIG. 2C. In addition to the choke coil L2, a [MUR4100E] diode D1 may be placed inline, between Collector 4 and anode 11, to establish a half wave rectification from ground state 5.

During transistor Q1 ON pulse(s), the voltage zone(s) will trigger both positive (anode) 11 and negative (cathode) 12 at the same time. Coulomb charges (voltage zones) associated with transistor Q1 switching modes 3 are felt instantly within the capacitors plates 11 and 12 surfaces. These "charged" lines of force extend outwardly at right angles from the surface of the capacitor 8. See FIG. 3C.

Increasing the plate size or decreasing gap spacing of the capacitor anode 11 and cathode 12 will also enhance the absorption cross-section to respective reference frame incoming or outgoing signals. Tighter gap spacing lower resistance levels of said capacitor C1 while, increasing gap spacing raises the dielectric 13 resistance values. Capacitive walls (11 & 12) should be made of any conducting material. Stainless Steel T304 has excellent strength and resistance to oxidation properties. A 30 awg resistive wire may be used for the choke coils to enhance the electron drift velocity retardation process. Typical turn count for this application can range from 10 to 3,000 turns or more. See FIG. 4A.

The negative resistance oscillations "pulls" on free electrons from the dielectric 13 modestly more than the cathode 12 ground source electrons "pushing" force. See FIG. 1B. This behavior is defined as the provoking behavior of electrical cavitations effect 18. This effect can be modulated and amplified because of the negative resistance oscillations 17.

Charging choke coils L1 and L2 resistance values can be set to 11.4 KOhms. This value is enough to completely impede/inhibit the electron drift velocity to the common ground state 5 electrons, while still stimulating dielectric atomic electron scattering and inelastic scattering.

See FIG. 2C. Placing a load electrical element such as a light bulb B1 or load resistive element resists electron drift velocities still further (energy harvesting). See FIG. 2C. Simply increasing the coil L2 turn-count increases magnetic field strength and resistance values between ground state 5 and the cathode 12 of the capacitor 8.

In FIG. 2B, depiction of the dielectric 15 and electrons in a kinetic energy state 18 (motion) are continuously triggered per each successive unipolar pulse 14. The kinetic electron pressure differentials with said capacitor 8 are now distributed as charge high pressure 16 and low pressure 17 within the capacitive plate antenna network 11 and 12. See FIG. 2C. Simply, increase voltage from power supply 6 or tighten the capacitor gap spacing "pulls" more electrons 15 from the dielectric 13 into the "Closed-Loop" circuit in a resonant charging oscillation operational mode. See FIG. 2B. In this configuration, the electronics network puts the electron into a bouncing Superposition state 21 of high-pressure differential between surging ON to OFF pulse(s). This is a sustained wave oscillation effect. Essentially, said capacitors 8 dielectric electrons flow 15 in a quantum state of Superposition 21 as the kinetic motion "flows" 15 into the anode 11 due to atomic cavitations 18 in the dielectric 13.

This begins the process of converting the said capacitor 8 from an "imaginary load" to more of a "real load" type of electrical quantum device. See FIG. 2C. This ultimately puts the electron into a bouncing Superposition state 21 of high-pressure differential between surging ON to OFF pulse(s).

Once the proper-triggering 14 of resonant frequency is obtained, the electrons 15, within the wire 21, become a sustained standing wave oscillation. This means the electrons are not moving in the wire, but have kinetic amplitude and potential force(s)—standing wave phenomenon. Superposition state 21 has now been achieved in the circuit within the ground state common ground and the dielectric medium 13. The dielectric 13 i.e. free electrons 15 established between the tuned resonant anode 11 of the capacitive plate 12 now share oscillating charge conjugates and migrate "physical move" charged wave particles i.e. electrons in a coupled superposition state toward anode plate 11 with little or no resistance—Quantum Kinetic Well. Since like charges repel each other and opposite charges attract each other, the electrons 15 migrate to anode 11, while positrons migrate to cathode 12. In the next electronics arrangement we will enhance the ground state 5 voltage using a secondary coil L3 and as a primary coil L4 as a voltage step-up transformer to said capacitor 8.

Figure 2D:
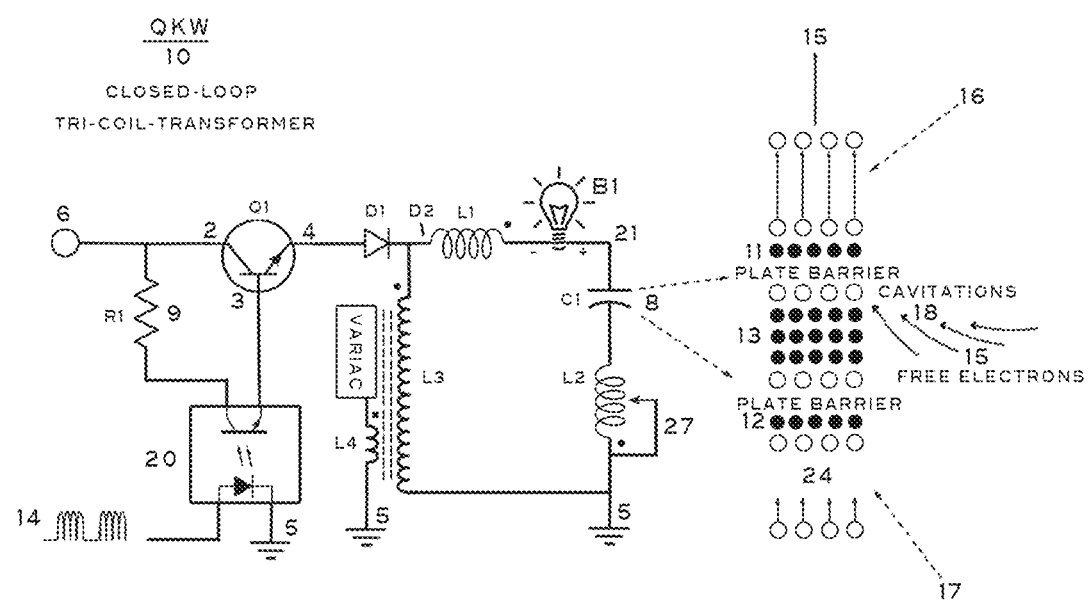
FIG. 2D is a schematic of Tri-Coil-Transformer construction, which acts as electrical ballast during resonant frequency step-up transformer operations. Much stronger QKW effects.

Tri-Coil Transformer Step-Up Charge—FIG. 2D

In the foregoing setup, a Tri-Coil-Transformer (T.C.T.) electronic stance will enhance resonant charging to capacitor 8. See FIG. 2D. In any transformer, the mutual inductance between primary coil and secondary coil determine the voltage and amperage ratings. L3 coil is the secondary pick-up coil, which steps up the voltage to capacitor 8. While, L4 is the primary coil, which determines step-up or step-down relationships. Said coils L3 and L4 are isolated by transformers tape and layered over each other (stacked arrangement). The closer the said two coils are the great mutual induction forces. See FIG. 4A.

The primary coil L4 will be powered by non-rectified 60 hz AC mains power. This mains power of 110 v AC will be varied using [W2 or W5] autotransformer up to 132 v (over-clocked mode stance). This AC power will be fed into a full-wave bridge rectifier [KBPC5010 50 amp 1000 v] before being fed into the variable DC power supply 42 and Q1, Q2 and Q3 transistor network [2N6678]. See FIG. 2G.

In this configuration, the transistor Q1 is fed rippled 120 hz DC VCC power 6 while, the primary coil L4 is fed 60 hz AC mains power at the same time. As W5 variac power is increased (attenuated up) to the variable power DC power supply 42 and transistors, the primary L4 simultaneously received proportional AC sine wave energy. This also acts to ballast on the overall "Closed-Loop" circuit. This ballasting effect by electron impedance also simultaneously steps-up voltage by the secondary coil L3. Step-up voltage levels between L4 and L3 are instantaneously imparted to the capacitors anode 11 and cathode 12 plate surfaces.

In this powerful configuration, the Quantum Kinetic Weill is triggered and enhanced to be a vector-able "push" and "pull" resonant audio transformer Atoms and charged particles in proximity to voltage plate sources will be "pulled" and "pushed" with tremendous electrostatic force.

In the next section, we will enhance the common ground state electron 5 with a modified impedance network using a center-tapped L3 secondary coil increasing the common ground 5 mass-to-charge ratios.

Figure 2E:
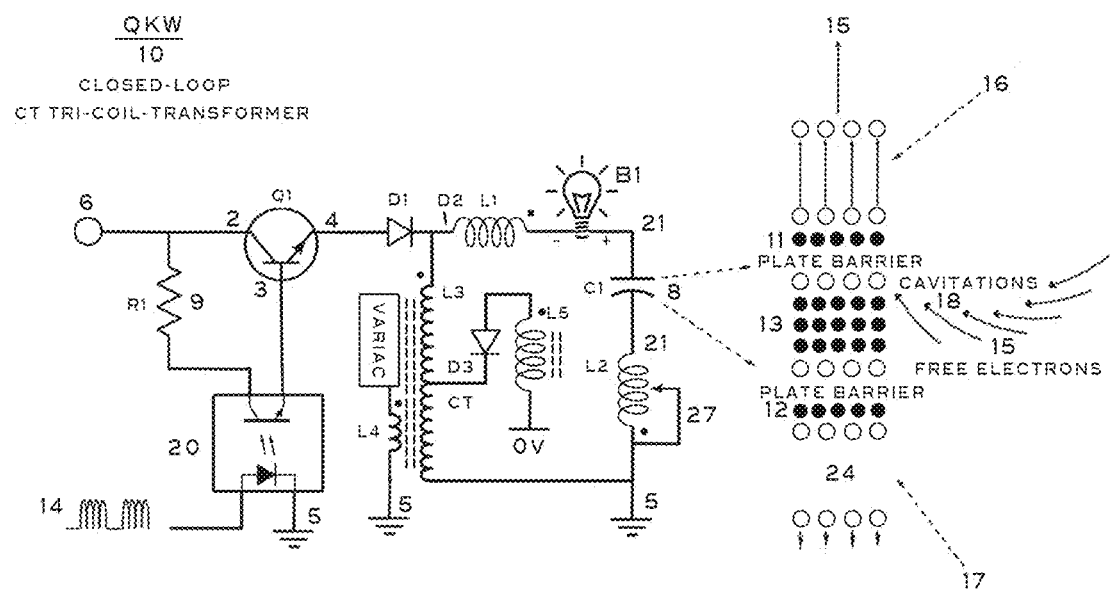
FIG. 2E is a schematic of the Tri-Coil-Transformer affixed with a center tap, which is grounded for enhanced capacitive polarizations and ground stance 5 balancing in the "Closed-Loop" circuit QKW field forces are enhanced further.

CT Tri-Coil Transformer Step-Up Charge—FIG. 2E

Center tapped transformers have several added benefits to the Tri-Coil-Transformer design. The CT transformers have a high power factor, low ripple voltage, can drive two independent plates, half-rectification and full rectification, two-phase or three phase wire systems and most importantly. It allows for efficient switching power supplies 42/43 operations. Another desirable feature is the voltage biasing ability. See FIG. 2G.

As in the previous Tri-Coil Transformer setup, the rectified 120 hz DC VCC power supply 6 feeds the transistor Q1 as a "Pull", while the AC mains 60 hz line is fed into the primary coil L4 as a "Push" feature. This strengthens the dynamic resistance values as primary coil L4 drives secondary coil L3 through mutual induction. This action, also superimposes a 60 hz amplitude modulated wave onto the resonant frequency unipolar bursts 14 from Q1 transistor networks. See FIGS. 2G & 2E.

CT Tri-Coil-Transformer is affixed with diode D3 to increase electron drift velocities are maintained during unipolar pulse bursts 14. While, coil L5 aids even further in electron retarding drift velocities. A load B1 may be affixed between said L5 coil and D2 diode to enhance energy harvesting electron transients. See FIGS. 2F, & 2G. The coil L5 wire end is now acts a zero-reference electron concentration point. We will call this the "Electron Grid" 41 via 0V. See FIGS. 2E & 2G. This 0V is placed between said capacitors 8 anode 11 and cathode 12. This stance is now an "Open-Loop" circuit pentode capacitor 8. This now allows the anode 11 to be driven with independent voltage from cathode 12 voltages. This is an enhanced form of electrical phase conjugations. The DC saturation of the core is enhanced because the DC current is the two halves of the Tri-Coil-Transformer secondary L3 flow in opposite directions.

As ground state electrons 12 and 15 are shunted from moving towards power supply 6 due to coil's electromagnetic field of L5 coil, the electron pressure 17 within in the said capacitor 8 now becomes much greater due to 0V electron grid 41. This forces a greater electro-static pressure within the capacitive matrix surface(s) 11 and 12.

Voltage pressure is instantaneous, while current 15 is quite slow within a circuit. Thus, if ground state current 15 is allowed to lag more than the capacitor current 15, the repealing voltage pressure can maintain the same "pressure" throughout the circuit. Thus, electron drift velocities within the ground state 5 of the circuit can be controlled to a nearly negligible amount. In this configuration, capacitive current 15 is now the weakest resistant (~109-1015 ohms/m for ambient air) element within the "Closed-Loop" 10 circuit. In this state, capacitive current 15 resistant viscosities arc less confined and thus move faster than the common ground 5 state current 15. And as we all know, electrons aim to take the path of least resistance. The stimulation of the Quantum Kinetic Well (device) has officially been fully triggered through negative differential resistance oscillations 24 in this mode. Surprisingly, there are even more advanced configurations that utilize this principle, which will be disclosed. See FIGS. 2E, 2F & 2G.

The high pressure 16 to low pressure 17 differential is now controlled not from the circuit ground state, but now the dielectric's ground state (Zero Point Energy) is being influenced by capacitor phase shift transformation from an "imaginary load" to a "real load" device. This is known as "tickling" state space matter 24 (negative differential electron pressure). The dielectric 13, in this mode, will show signs of micro-cavitations 18 in the form of super-soft-luminous X-Rays (6 eV-2 KeV) as dielectric mediums 13 attempt to readjust to this fundamental force. See FIG. 5A-5D. Input voltages from said power supply 42 can be as low as 6 to 12 volts to induce these dielectric renormalization effects (S.S.L.X-Rays), which in modern day electronics, would never take place . . . . Only in Nature.

To enhance dielectric polarization effects further, incorporate L5 coil in a sandwiched manner as a trifilar coil winding with L1 and L2 respectfully.

We shall now introduce the negative differential electron pressure mechanic of the disclosure. This electrical stance is coined "Electron Extraction". The mechanism here, once all other technical aspects of the invention have been properly established, thus triggers a negative void coefficient in the said dielectric medium 13. We enter now into, "Electron Extraction", which can "pluck" electrons out of the temporal fabric of water, air, liquid metals and even the vacuum of space . . . . See FIG. 2F.

Figure 2F:
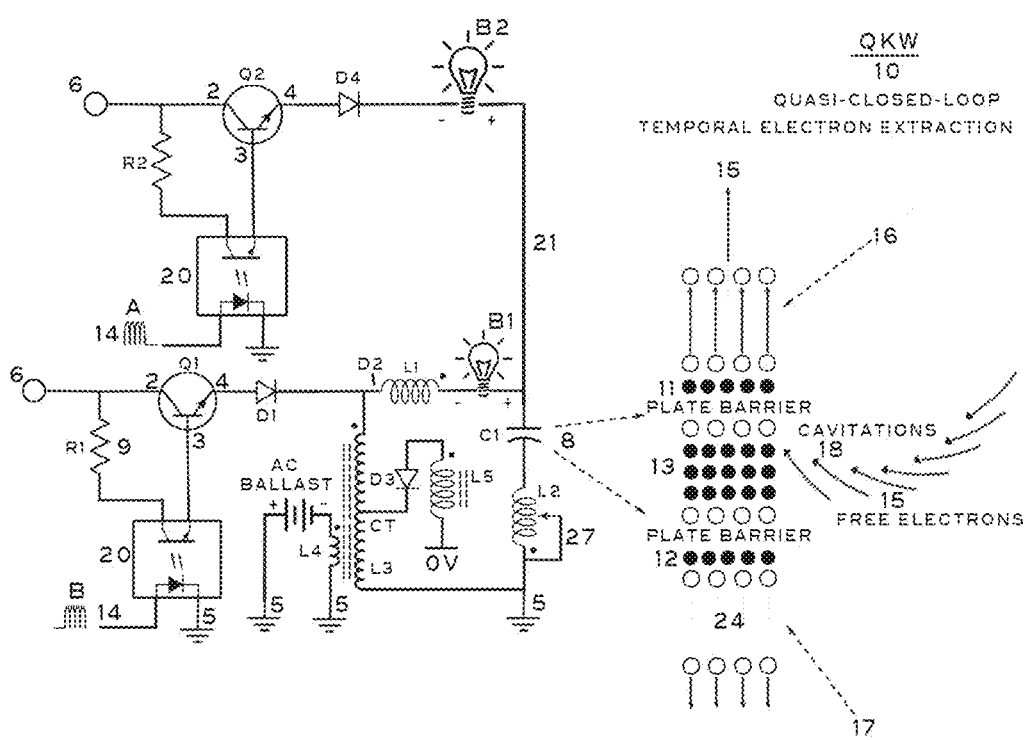
FIG. 2F is a schematic of the Tri-Coil-Transformer affixed "Electron Extraction" circuit to establish proper negative differential electron pressures 24. QKW fully triggered and stimulated.
Figure 2G:
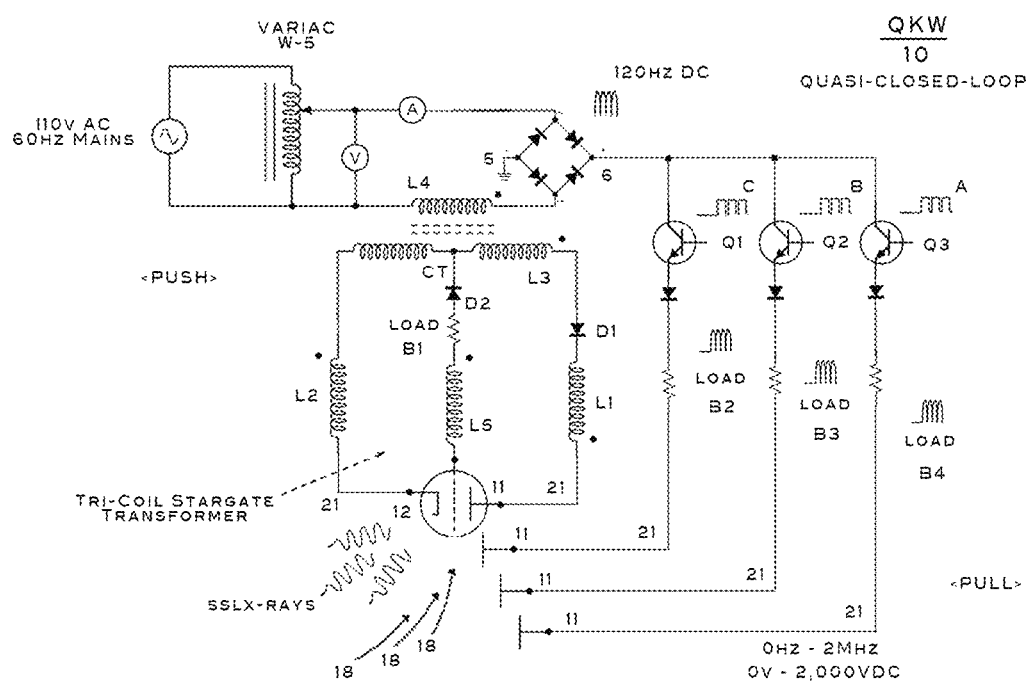
FIG. 2G is a schematic of L1 and L2 interlacing "Resonant Charging Chokes" establishing enhanced resonant RLC tank circuit design. Stronger stimulation of QKW.

Temporal Electron Extraction—FIG. 2F

The CT or standard Tri-Coil-Transformer is now affixed with a second transistor Q2 and/or Q3. See FIGS. 2F & 2G. The Q2 transistor now pulses during the OFF time of Q1. Q2 will pulse with "A" input and Q1 will trigger with "B" input. This is a switching (burst) mode operation. When Q2 trigger pulse is ON state, the ground state electron 5 from the dielectric 13 are "pulled" into the anode 11. This phenomenon is called "electron extraction". It, in turn, forms a negative differential electron pressure 24 within the entire "Closed-Loop" electronic circuit. See FIG. 5A-5D.

This negative differential electron pressure is not only felt in the said capacitor 8 but. in adjacent neighboring electronic components. As cavitations 18 are induced to the said dielectric 8 of the capacitor C1, the mass density is converted to energy in the form of electron flow into B2 amp consuming device(s). See FIG. 2F. This is classified as a "negative feedback" loop and can be arranged into the circuit as a "self-sustained oscillation".

Since L1 and L2 coils are bifilar joined, the electron flow 15 from common ground 5 through L2 coils are impeded by electrons attempt to renormalize in the opposite direction in said L1 coil. This cavitates the said capacitors 8 in negative differential electron pressure changes 24. This is similar to a venturi creating differential pressure sucking gasoline into the intake manifold of an old carbureted engine. Electrons are now converted into heat and light energy from the energized light bulb B2, B3 etc. Any amp-consuming device, load, may be placed in series of parallel in the electron extraction schematic to meet predetermined needs. Negative resistance differential electron pressures are at highest levels during resonating operations in this wiring configuration. Simply increase L1, L2, L3, L5 turn count to enhance the effects of the Quantum Kinetic Well 10 effects on any device application.

Figure 4A:
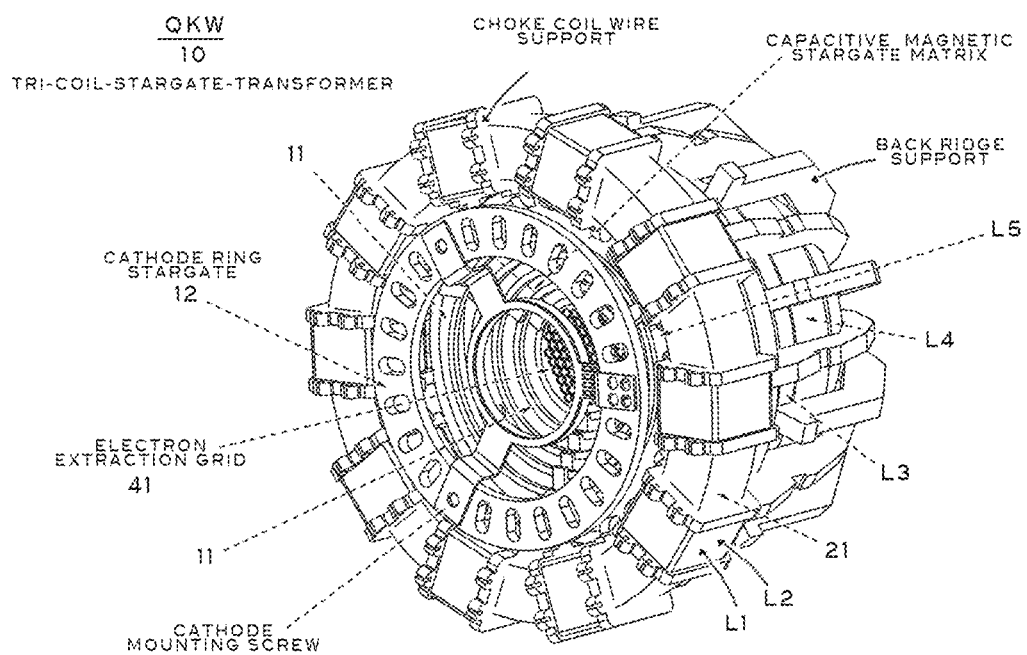
FIG. 4A is a isometric view of the Tri-Coil-Stargate-Transformer layout.

Arc Reactor Cold Fusion Device—FIG. 4A—AD

To enhance the Quantum Kinetic Well application design approach further, utilization of energizing and collapsing magnetic field lines 40 to guide capacitive atomic free electrons into the circuit is disclosed. See FIG. 4A. This apparatus coil design is called the Tri-Coil-Stargate-Transformer. The induced toroidal magnetic field lines of the electrically energized transformer guide or direct free atomic electrons 15 towards the "electron grid" 41 section(s) of the apparatus. This is accomplished by spin-orbit coupling. Angular momentum of atomic electrons may be influenced by an external magnetic field. This is due to the electrons innate magnetic dipole (N to S magnetic field). Since electrons 15, are electromagnetically charged angular momentum spinning entities, they are influenced or moved by perpendicular magnetic fluxing 40 fields. See FIG. 4C. The Stargate magnetic field is arranged in such a way to "draw" in the electromagnetically charged constituents, and any other electrically charged particles such as gluons, mesons and gluons.

Figure 4B:
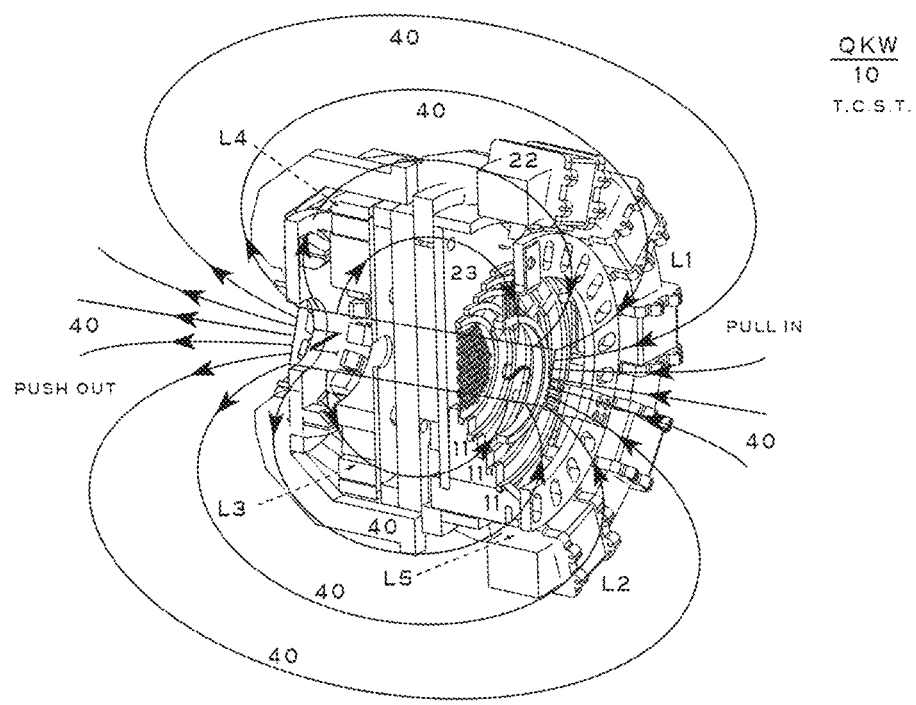
FIG. 4B is a isometric cutaway view of the Tri-Coil-Stargate-Transformer layout. This includes the primary L4 and secondary L3 coil magnetic field lines.
Figure 4C:
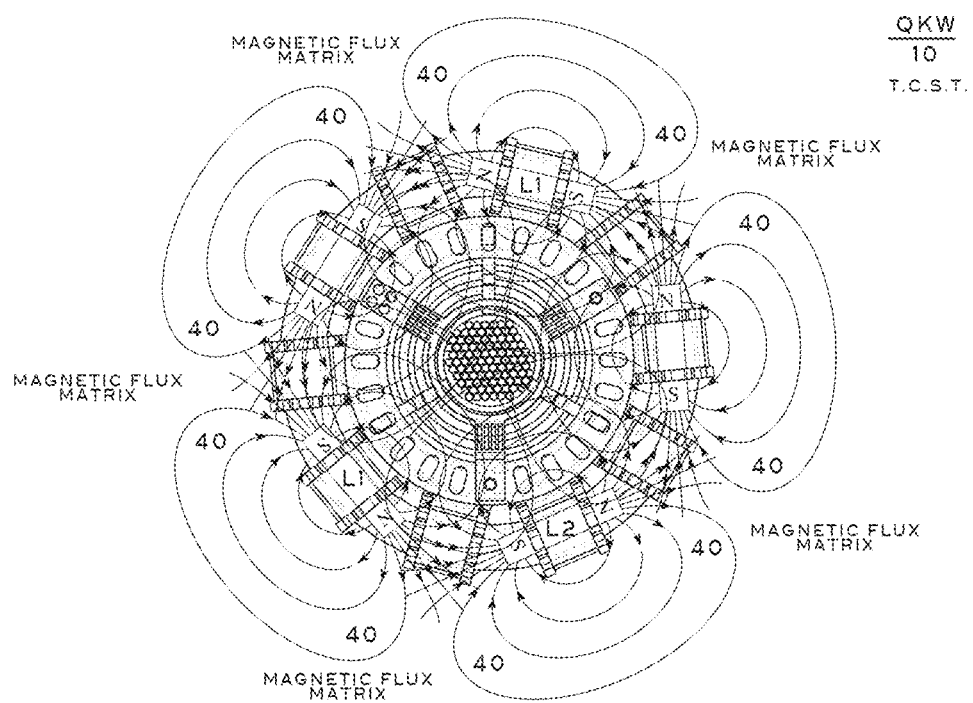
FIG. 4C is a front facing view of the Tri-Coil-Stargate-Transformer depicting the "Resonant Charging Chokes" affixed to toroidal core around capacitive plates 11, 12 and 41.
Figure 4D:
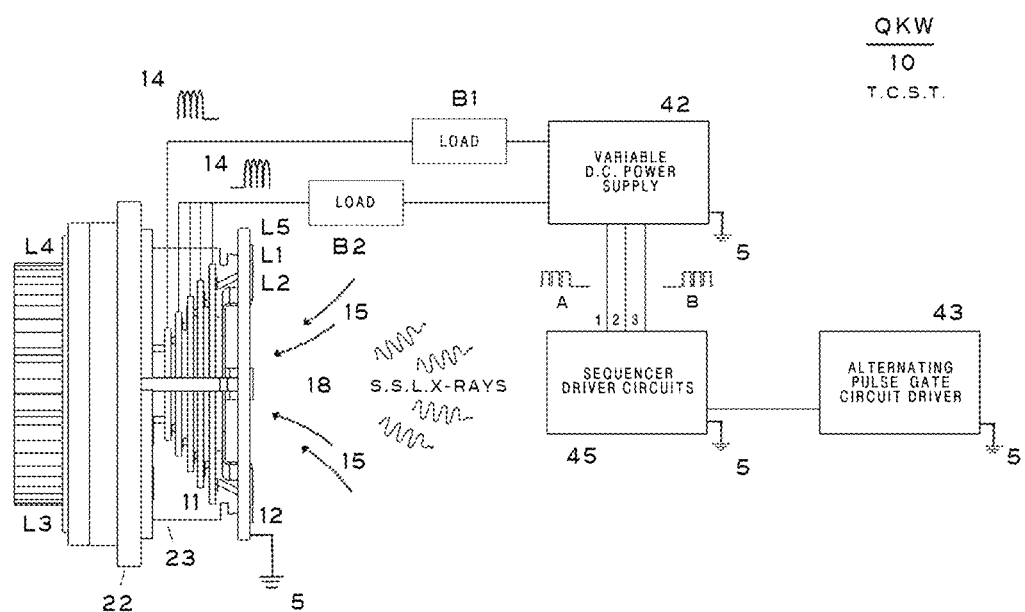
FIG. 4D is a block diagram of electrical components in relation to the Tri-Coil-Stargate-Transformer.
Figure 5A:
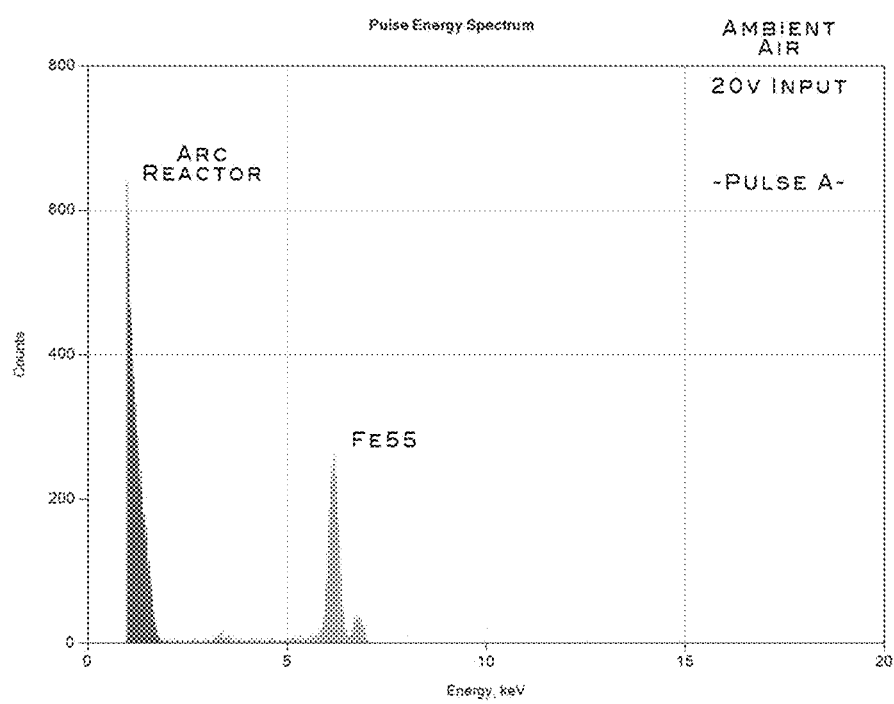
FIG. 5A is a spectrum analysis of operation using an Amptek XR100-CR Si-PIN detector. Pulse A analyzed with ambient air ionization peaks at 20 v input.
Figure 5B:
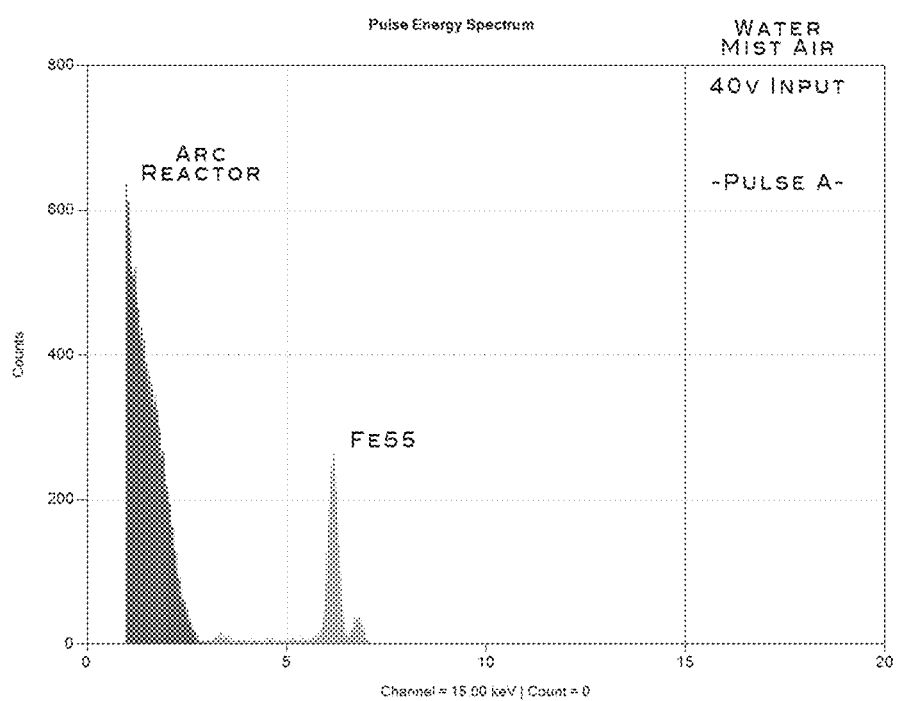
FIG. 5B is a spectrum analysis of operation using an Amptek XR100-CR Si-PIN detector. Pulse A analyzed with ambient air water mist ionization peaks at 40 v input.
Figure 5C:
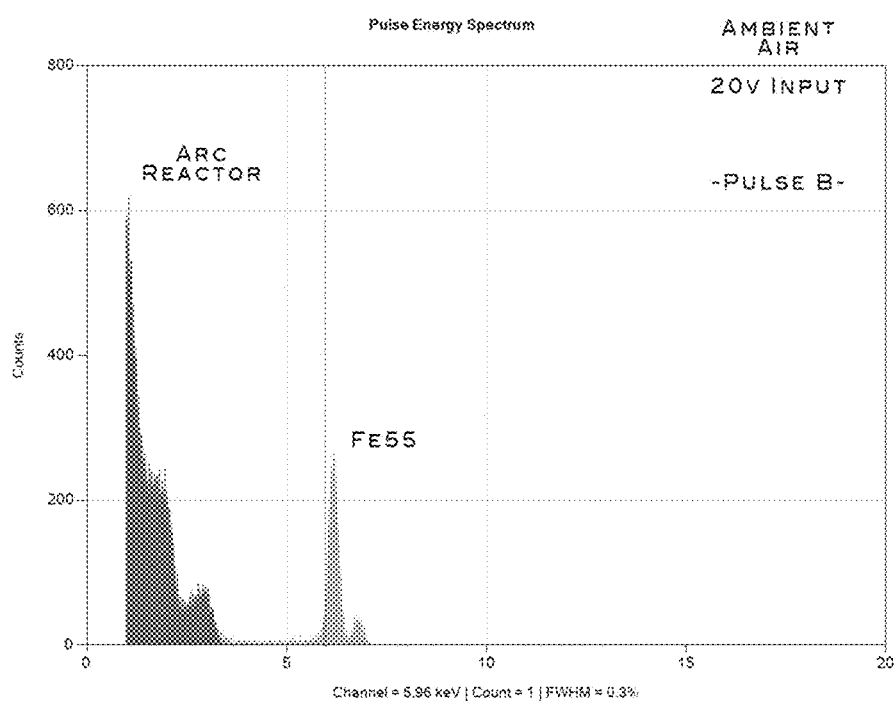
FIG. 5C is a spectrum analysis of operation using an Amptek XR100-CR Si-PIN detector. Pulse B analyzed with ambient air ionization peaks at 20 v input.
Figure 5D:
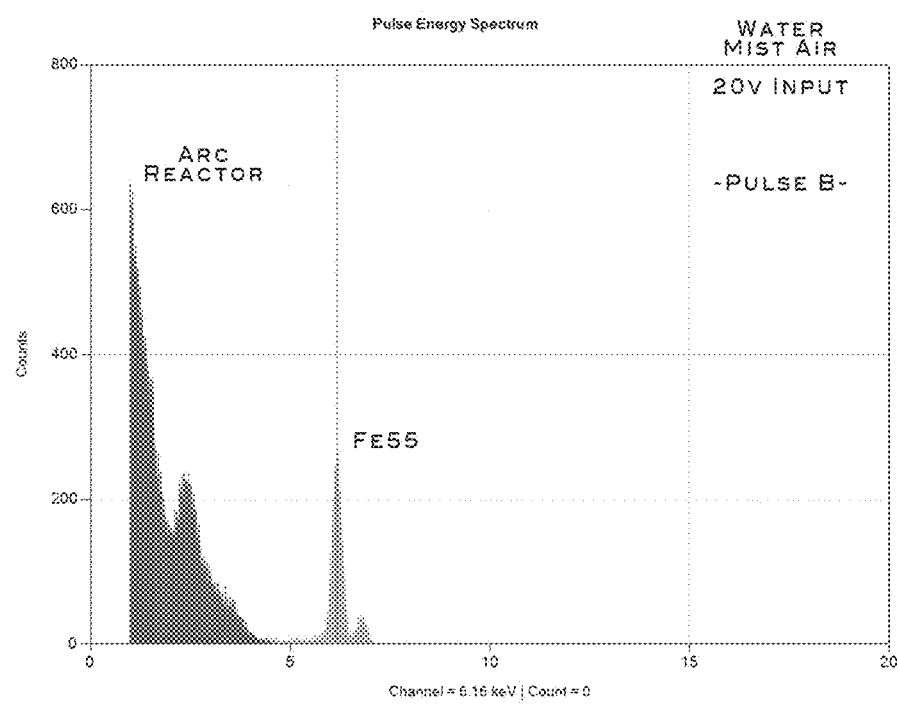
FIG. 5D is a spectrum analysis of operation using an Amptek XR100-CR Si-PIN detector. Pulse B analyzed with ambient air water mist ionization peaks at 20 v input.

In retrospect to operational parameters, led's light spectrum (extending from the visible red 660 nm to Ultraviolet light regions) can be selected for a given or predetermined electromagnetically gas priming application since dielectric gaseous matter nucleus is more responsive to coherent, rather than diffused light source(s) 23. See FIGS. 3A & 4B. Photon excitation pulse frequency should match the resonant frequency of the tuned T.C.T. and/or T.C.S.T. tuned capacitor network 8. The momentum of the photon in the direction of the propagation traversing the medium (dielectric 13) of space is, thus, expressed by equation: hv/c.

The T.C.S.T. now uses all fundamental forces including electrostatic, magnetic, photonic and mass-to-charge (gravity) ratios to stimulate the on demand energy-harvesting practices. With this device application configuration, it only takes around 12 to 20 volts of negative differential electron pressure 24 to induce solar wind ionization levels. See FIG. 5A-5D.

Below is a table of the electron voltage pressure ratings and their affect upon a water dielectric. This phenomenon can take place in air, water, metallic liquid and even the vacuum of space.

TABLE I

DIELECTRIC BREAKDOWN PER ELECTRON-VOLT
POTENTIALS INPUT TO ATOMIC OUTPUT REACTANCE
THE QUANTUM KINETIC WELL—
ZERO POINT ENERGY

STAGE 1 : (0 eV-0.001)
Random orientation movements of charged particles in a relativistic space and time frame. Zero-Point Energy Vacuum random flux vibrations
STAGE 2: (0.01-3 eV)
Charged particle alignment to capacitive plates i.e. Free Electrons align to Polarization Plate Zone Barriers
STAGE 3 (3 eV-11.8 eV)
Capacitive dielectric electron cloud elongation and changing time-share rate of the electron to the positive core nucleus of the atom
STAGE 4: (12.3 eV-12.8 eV)
Ionization of hydrogen atoms within the triggering of dielectric collapsing
STAGE 5: (13 eV-110 eV)
Matter conjugate polarization and deformation into closed-loop circuit
STAGE 6: (120 eV-2,000 eV)
Atom ionization and Townsend cascading Self-Maintained Discharge Technical Problem Circuit components have voltage limits and current limit ratings. These rating limits must be followed during operation of this device. However, there are ways to counter this. Those skilled in the art will engineer to maximize circuit component ratings to schematic designs and parameter for optimized operations.

Advantageous Effects of the Invention

Various applications to this invention can be utilized. A few of the amazing applications include and are not limited to: Self-Induced transformers excitation, High to Low Electron Pressure dielectric energy harvesting, quantum computing applications, dielectric oscillations for heat generation and X-Ray generation, attenuating electron pressures within a metallic surface inducing lowered drag confinements, fusion technique of dielectric substrates, light weight power generators for charging electrical units or batteries, new ionic filtration precipitator collection systems, hydrogen laser EASER (Electric Amplification by Stimulated Emission of Radiation) technology, super-soft luminous X-Ray pulsing machines (blasters), dielectric electron space-time manipulating devices.

All this is possible due to one simple fact: raising voltage levels while restricting amps in a dead-short "Closed-Loop" negative differential electronic circuit with any device application. The technology is only limited by the imagination of the engineer.

DESCRIPTION OF EMBODIMENTS

[2N6678 Power Transistor Connected to T.C.T. Assembly]

A 2N6678 power transistor connected to VCC and GROUND state of a power supply. 2N6678 power transistor connected to Tri-Coil-Transformer bobbin assembly. See FIGS. 4A & 4B. The triggered phototransistor 20, or series of optocouplers H1D11 is triggered from a 5 volt square wave oscillator connects to ground state. The power supply 6 is passed through a current resisting resistor R1 [100 ohm at 10 watts] to protect the base 3 of the 2N6678. This electrical arrangement ensures stable operations within "Closed-Loop" parameters to be met during pulsing triggering. T.C.T. L1 and L2 are 30AWG magnetic copper wire in a bifilar wrapped configuration at 1,300 turns around the toroidal bobbin. See FIG. 4A. L3 coil is also magnetic copper at 36AWG and is wrapped 300 turns around outer bobbin. Primary coil L4 is 24AWG magnetic copper wire wrapped around L1 and L2 at 200 turns. This coil arrangement resonates at 115 KHz frequency. Encompassing the coils L1, L2, L3 and L4 into a "Stargate" formation enhances the electromagnetic flux density of the Tri-Coil-Transformer. See FIG. 4A-4D.

[T.C.S.T. Arc Reactor Generator—AIR/VACUUM/MIST CLOUDS]

The electrodes are composed of stainless steel T304 or any other electro-conductive material. These metal rings are referred to as "Exciters" as their function is to act similar to a tuned Helmholtz musical pipe(s). The primary center electrode is the "electron extraction grid" plate 41. It is 0.73-inche in diameter and 0.15-inches thick. It has hexagonal holes drilled through the surface to enhance the surface area volumetrically. The first anode ring "Exciter" nearest to the electron extraction grid plate has an O.D. of 0.75-inches and an ID of 0.66-inches. The second "Exciter" ring has an O.D. of 0.96-inches with an I.D. of 0.87-inches, lire third "Exciter" ring has an O.D. of 0.96-inches with an I.D. of 0.87-inches. All anode 11 "Exciter" rings are 0.2-inches thick and sit 0.325-inches from each other. The outer electrode ring, cathode 12 is the Stargate electrode affix near amp inhibiting coil L5. It has an O.D. of 1.16-inches with an I.D. of 1.08-inches. Please, note these "Exciters" should be polished and smooth. The ring "Exciters" round tribe design allows air passage and photon wave excitation to pass through into the capacitor Stargate regions. See FIG. 4C. Utilization of more exotic materials such as platinum will aid in hydrogen ion saturation within the Tri-Coil-Stargate Transformer 10 during resonance 14. The disclosed device may be scaled up for predetermined means of energy generation.

Application permits a new form of energy harvesting and management opportunities. And not limited to atomic transmutation, ionic filtration devices, quantum computing, water heating oscillators, air ionization, energy vectoring, new ionic filtration devices, materialization of new forms of matter, water utilization for jet/super rocket propulsion, resistance restriction for aeronautic winged-or-saucer craft. Alcubierre drive systems, electrical particle generators, hydrogen production from water, powering engines, powering rockets and many other combustion engines.

I claim:

1. A closed loop circuit, comprising:
   a transistor operable as a microscopic switch device to amplify electron pressures, the transistor having a collector connected to a positive voltage source;
   an optocoupler, connected in parallel to the positive voltage source, and triggered in response to a triggering unipolar pulse from a network, wherein an output of the optocoupler is connected to a base of the transistor;
   a capacitor, connected between the emitter of the transistor and a ground, and having an anode and a cathode for receiving a capacitive dielectric medium therebetween, such that, electrons flow through dielectric medium to the transistor from a ground state in order to break down the dielectric material.

2. The closed loop circuit of claim 1, wherein the positive voltage source is one of a converted step-up transformer or an AC to DC variac.

3. The closed loop circuit of claim 1, wherein the transistor is at least one of an NPN, PNP or MOSFET type semiconductor.

4. The closed loop circuit of claim 1, further comprising an amp inhibiting coil in series between the capacitor and the ground, for aiding in impedance amperage restriction.

5. The closed loop circuit of claim 4, further comprising a wiper arm of the amp inhibiting coil for allowing fine-tuning band gain filtering attenuations to the amp inhibiting coil.

6. The closed loop circuit of claim 1, further comprising a frequency bypass coil in series between the emitter of the transistor and the capacitor for allowing instantaneous voltage perturbations to the capacitor.

7. The closed loop circuit of claim 1, further comprising a load resistive electrical element in series between the emitter of the transistor and the capacitor to resist electron drift velocities.

8. The closed loop circuit of claim 1, further comprising a primary coil and a secondary coil, wherein the secondary coil is in series between the emitter of the transistor and the ground, and in parallel to the capacitor, for stepping up voltage to capacitor, and wherein the primary coil is connected to a separate power supply and interacts with the secondary coil to determine step-up or step-down relationships.

9. The closed loop circuit of claim 8, further comprising a second amp inhibiting coil connected between the secondary coil and a zero-reference voltage, for aiding in electron retarding drift velocities.

10. The closed loop circuit of claim 1, wherein the transistor is a first transistor and further comprising a second transistor connected in parallel with the first transistor to the capacitor wherein the second transistor is configured to pulse during an OFF interval of the first transistor so that the second transistor pulses with "A" input and the first transistor triggers with a "B" input.

11. The closed loop circuit of claim 1, further comprising an amp inhibiting coil in series between the capacitor and the ground, for aiding in impedance amperage restriction and a frequency bypass coil in series between the emitter of the transistor and the capacitor for allowing instantaneous voltage perturbations to the capacitor, wherein the amp inhibiting coil and the frequency bypass coil comprise a tri-coil transformer in which the respective coils are bifilar coils wrapped together side by side around one of a solenoid core or toroidal core.

12. The closed loop circuit of claim 1, wherein the dielectric material comprises water which is dissociated into hydrogen and oxygen.

13. A closed loop circuit, comprising:
    a transistor operable as a microscopic switch device to amplify electron pressures, the transistor having a collector connected to a positive voltage source;
    an optocoupler, connected in parallel to the positive voltage source, and triggered in response to a triggering unipolar pulse from a network, wherein an output of the optocoupler is connected to a base of the transistor;
    a capacitor, connected between the emitter of the transistor and a ground, and having an anode and a cathode for receiving a capacitive dielectric medium therebetween, such that, electrons flow through dielectric medium to the transistor from a ground state in order to break down the dielectric material;
    a tri-coil transformer comprising an amp inhibiting coil in series between the capacitor and the ground, for aiding in impedance amperage restriction, and a frequency bypass coil in series between the emitter of the transistor and the capacitor for allowing instantaneous voltage perturbations to the capacitor, wherein the amp inhibiting coil and the frequency bypass are bifilar coils wrapped together side by side around one of a solenoid core or toroidal core;
    wherein the anode and the cathode of the capacitor are concentrically-mounted cylindrical components mounted along a central axis of the tri-coil transformer.

* * * * *